(12) United States Patent
Harada et al.

(10) Patent No.: US 8,342,720 B2
(45) Date of Patent: Jan. 1, 2013

(54) VEHICLE LIGHT AND ROAD ILLUMINATION DEVICE

(75) Inventors: Mitsunori Harada, Tokyo (JP); Takashi Akutagawa, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 337 days.

(21) Appl. No.: 12/731,137

(22) Filed: Mar. 24, 2010

(65) Prior Publication Data

US 2010/0201248 A1 Aug. 12, 2010

Related U.S. Application Data

(63) Continuation-in-part of application No. 12/577,714, filed on Oct. 12, 2009.

(30) Foreign Application Priority Data

Oct. 10, 2008 (JP) .................................. 2008-264439
Mar. 24, 2009 (JP) .................................. 2009-071954

(51) Int. Cl.
*F21V 3/00* (2006.01)
*F21V 5/00* (2006.01)
(52) U.S. Cl. ................... 362/311.06; 362/510; 362/293; 313/498; 313/501; 313/506; 257/98
(58) Field of Classification Search .......... 362/487–522, 362/84, 260, 311.06, 293; 313/498–512; 257/98
See application file for complete search history.

(56) References Cited

U.S. PATENT DOCUMENTS

| 7,049,159 | B2 | | 5/2006 | Lowery | |
| 7,168,837 | B2 | * | 1/2007 | Ishida et al. | 362/539 |
| 7,520,645 | B2 | * | 4/2009 | Ishida | 362/507 |
| 7,597,465 | B2 | * | 10/2009 | Inaba et al. | 362/538 |
| 7,736,036 | B2 | * | 6/2010 | Tatsukawa | 362/522 |
| 7,896,532 | B2 | * | 3/2011 | Hsu et al. | 362/518 |
| 7,980,732 | B2 | * | 7/2011 | Kawamura | 362/308 |

(Continued)

FOREIGN PATENT DOCUMENTS

EP 2 065 948 A2 6/2009

(Continued)

OTHER PUBLICATIONS

European Search Report for EP 10 00 3064 dated Jul. 20, 2010.

*Primary Examiner* — Nimeshkumar Patel
*Assistant Examiner* — Jose M Diaz
(74) *Attorney, Agent, or Firm* — Kenealy Vaidya LLP

(57) ABSTRACT

A vehicle light and a road illumination device can include a semiconductor light emitting device capable of forming a luminance distribution where the light with a maximum value can be arranged at or near a light distribution cutoff line, thereby improving its light utilization efficiency. The vehicle light can include a semiconductor light emitting device including a semiconductor light emitting element and a wavelength conversion layer having a thickness-decreased portion that is formed substantially at a center line of the semiconductor light emitting element and extending to one end thereof so that the thickness is reduced from the center portion toward the one end. A projection optical system for forming a cutoff line can be configured to project a plurality of light source images each including an image portion corresponding to the thickness-decreased portion at its upper area, and to arrange the image portions in at least one of a horizontal direction and an oblique direction.

13 Claims, 25 Drawing Sheets

U.S. PATENT DOCUMENTS

| | | | |
|---|---|---|---|
| 8,070,339 B2 * | 12/2011 | Koike | 362/538 |
| 2004/0090790 A1 * | 5/2004 | Ishida et al. | 362/507 |
| 2005/0057917 A1 | 3/2005 | Yatsuda et al. | |
| 2005/0242355 A1 | 11/2005 | Guenther et al. | |
| 2005/0244993 A1 | 11/2005 | Bogner et al. | |
| 2006/0215415 A1 * | 9/2006 | Suzuki et al. | 362/539 |
| 2006/0226758 A1 | 10/2006 | Sofue et al. | |
| 2009/0001490 A1 | 1/2009 | Bogner et al. | |
| 2009/0134417 A1 * | 5/2009 | Sato et al. | 257/98 |

FOREIGN PATENT DOCUMENTS

| | | |
|---|---|---|
| JP | 2001-244507 A | 9/2001 |
| JP | 2002-185048 A | 6/2002 |
| JP | 2003-526212 A | 9/2003 |
| JP | 2005-109434 A | 4/2005 |
| JP | 2005-322923 A | 11/2005 |
| JP | 2006-313886 A | 11/2006 |
| JP | 2008-507850 A | 3/2008 |
| WO | WO01/24283 A1 | 4/2001 |

* cited by examiner

Fig. 3
Conventional Art
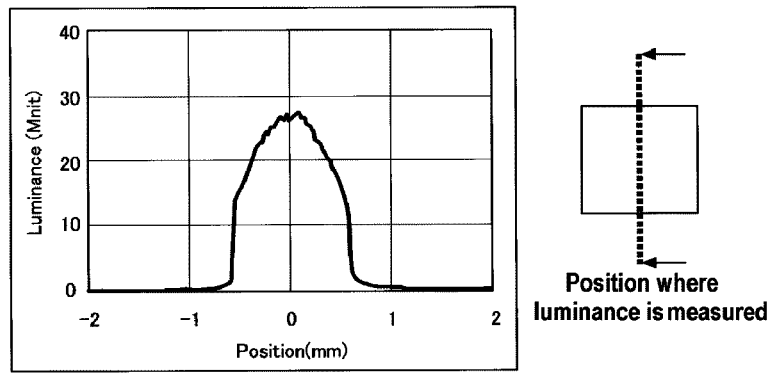
Fig. 4
Conventional Art
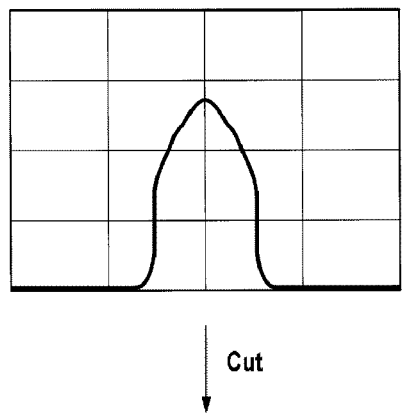
Cut
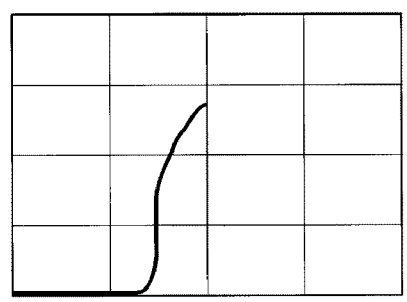

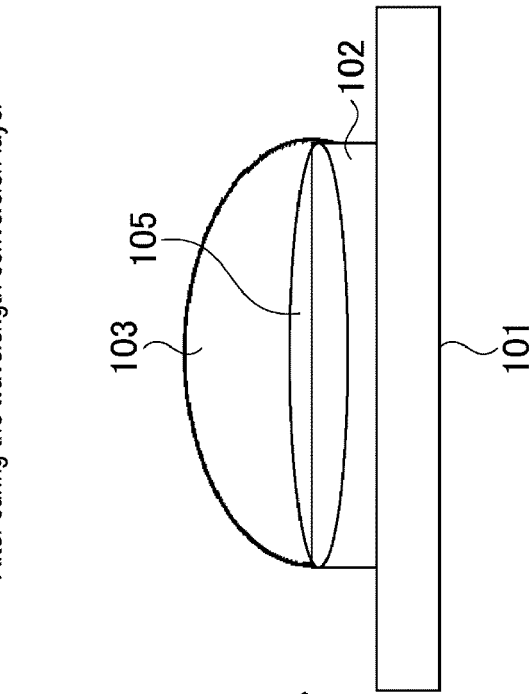
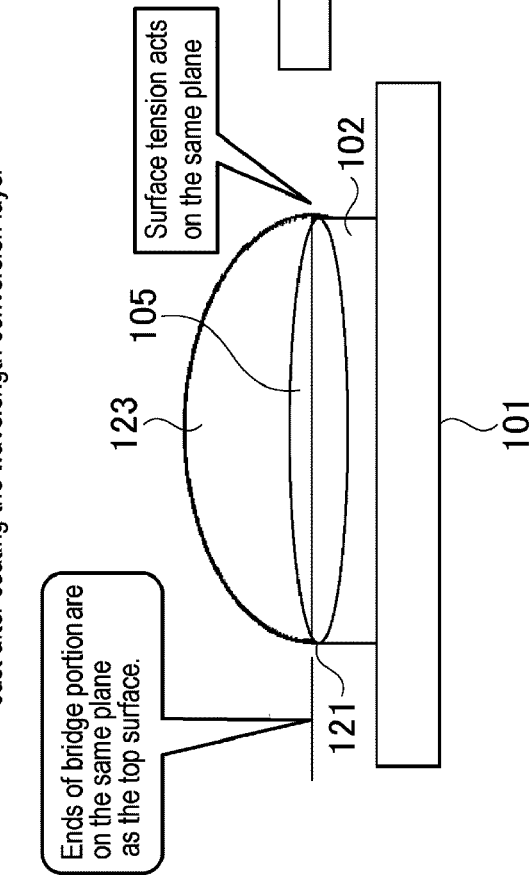

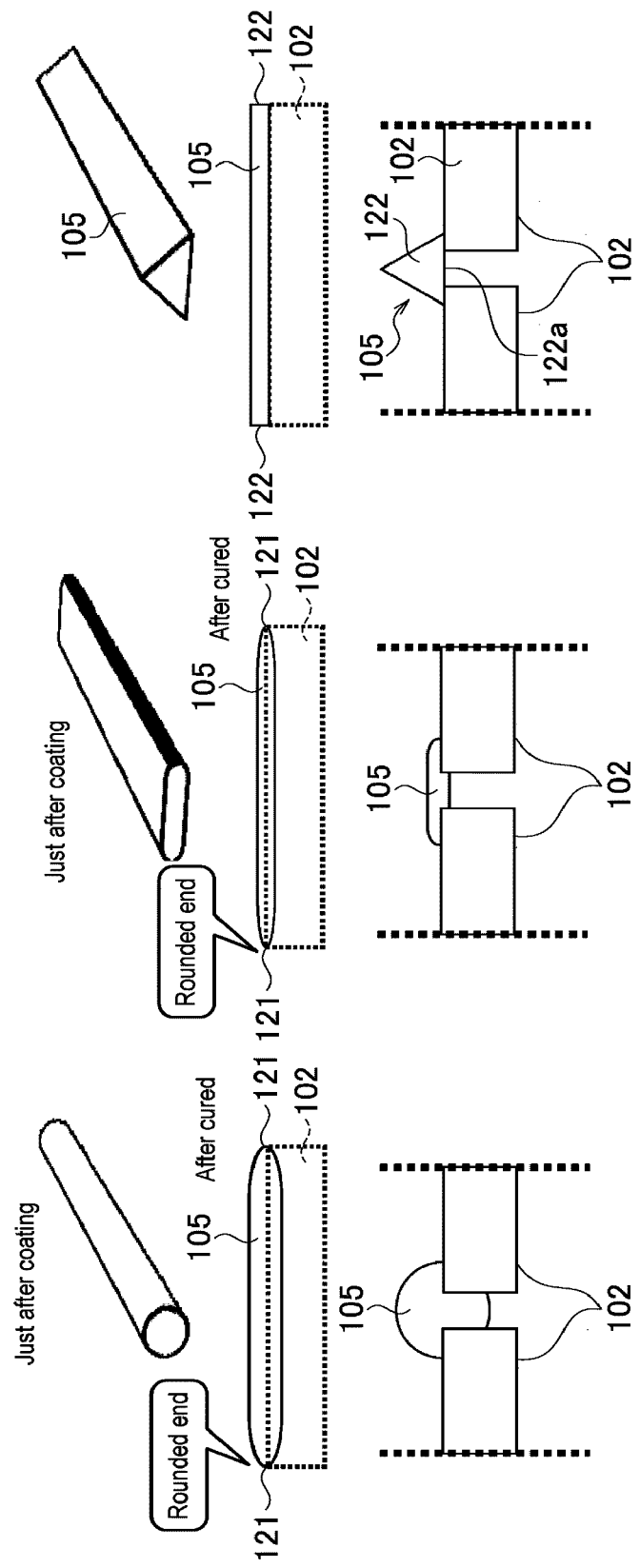

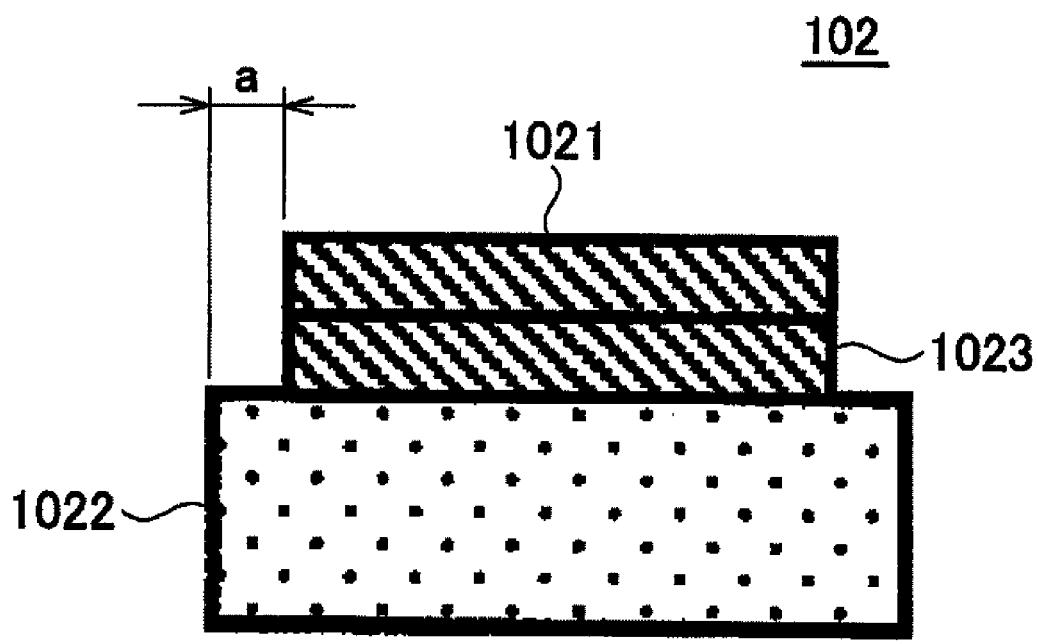

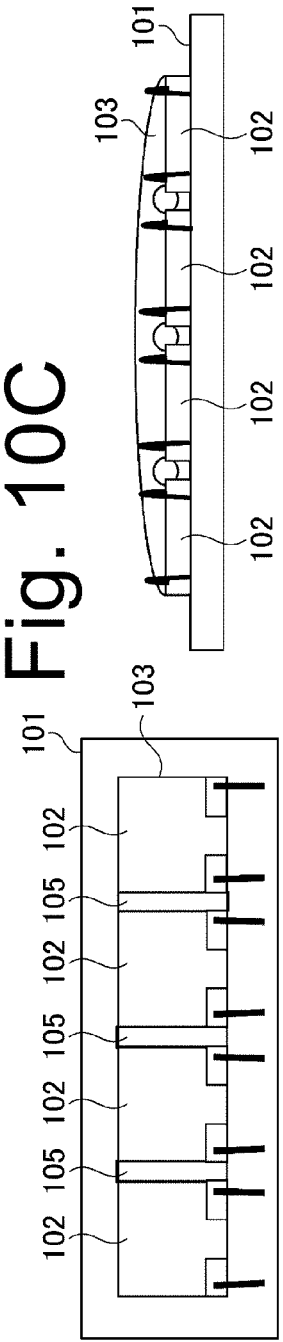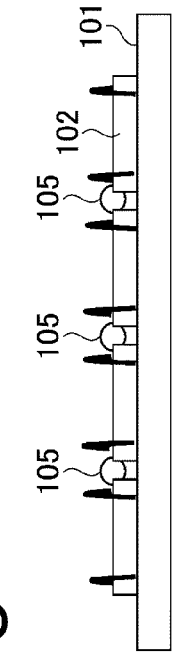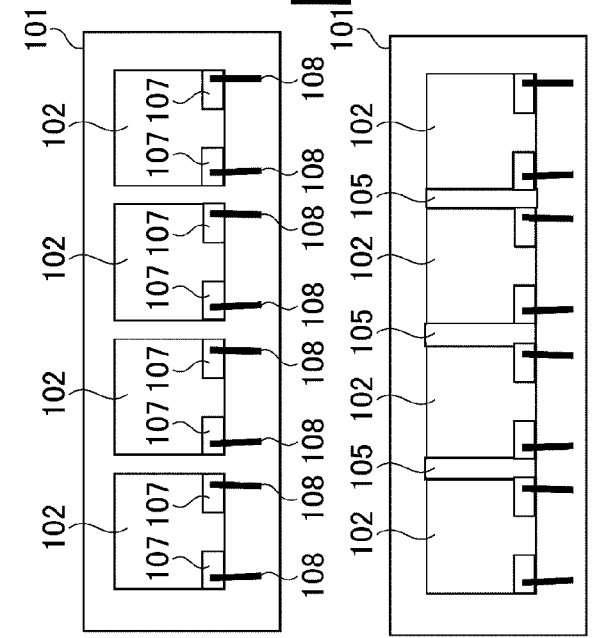

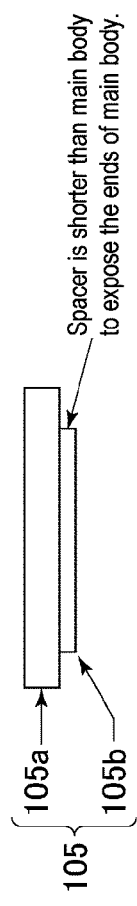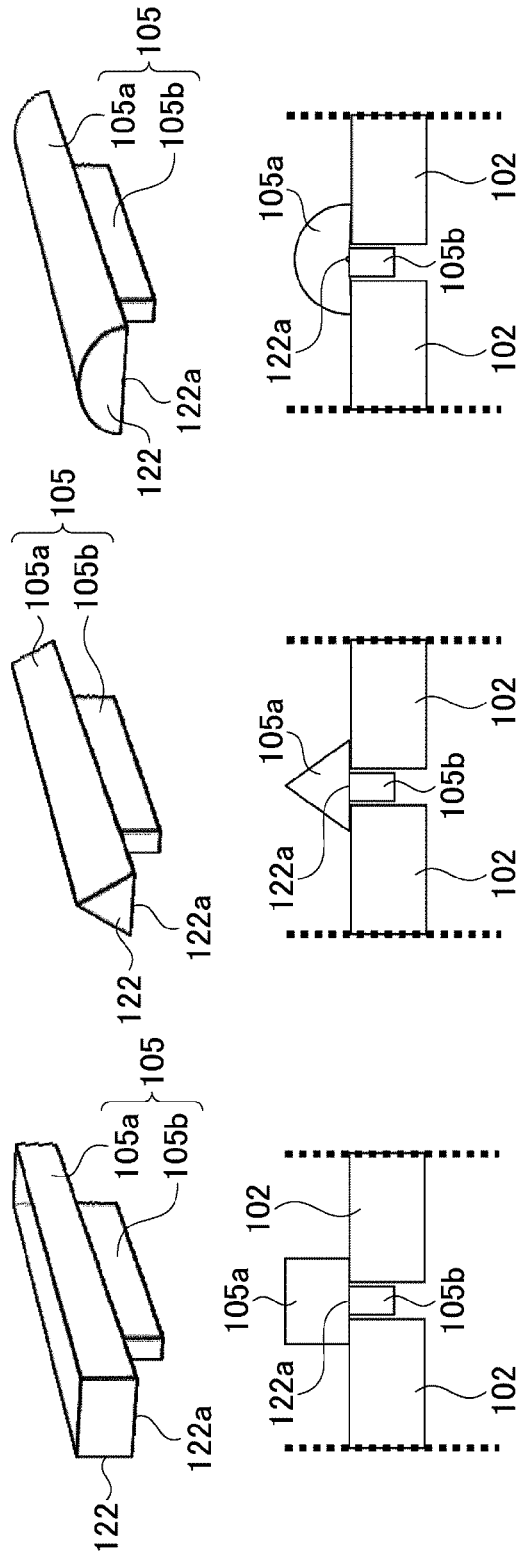

Bridge portions are disposed between the elements.

After coating the wavelength conversion layer

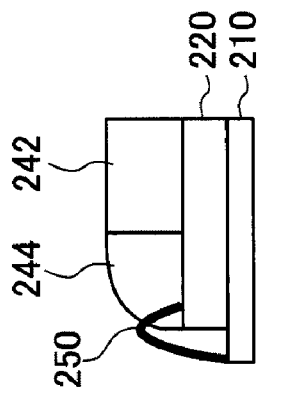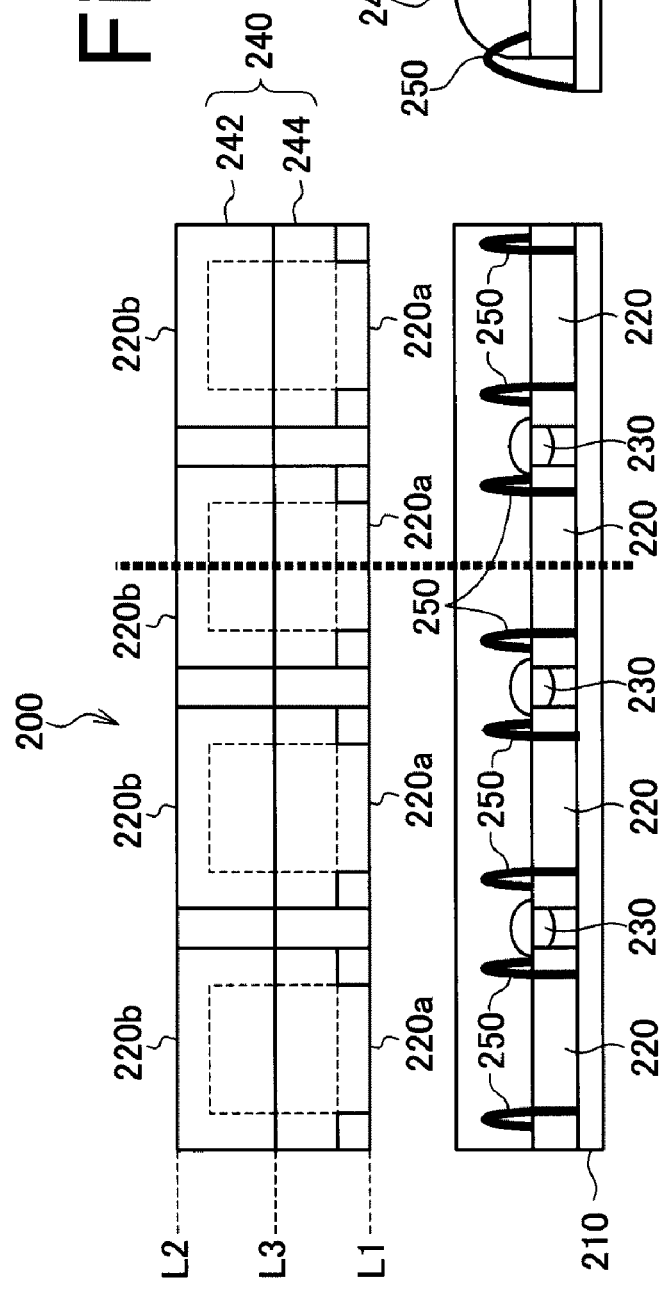

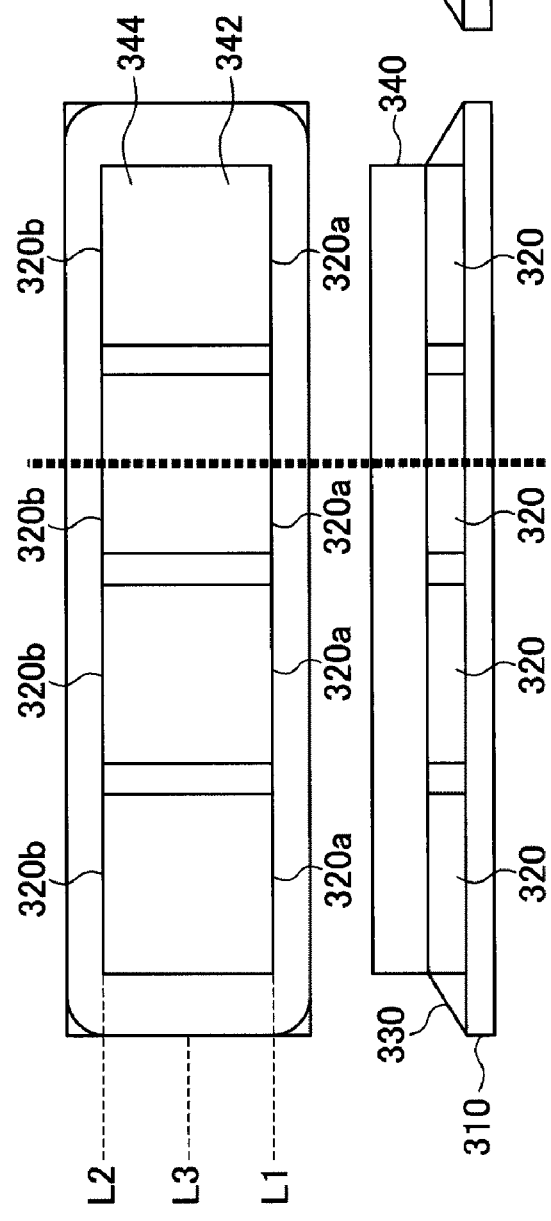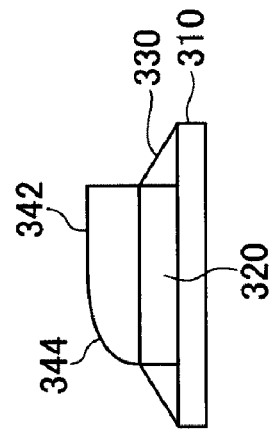

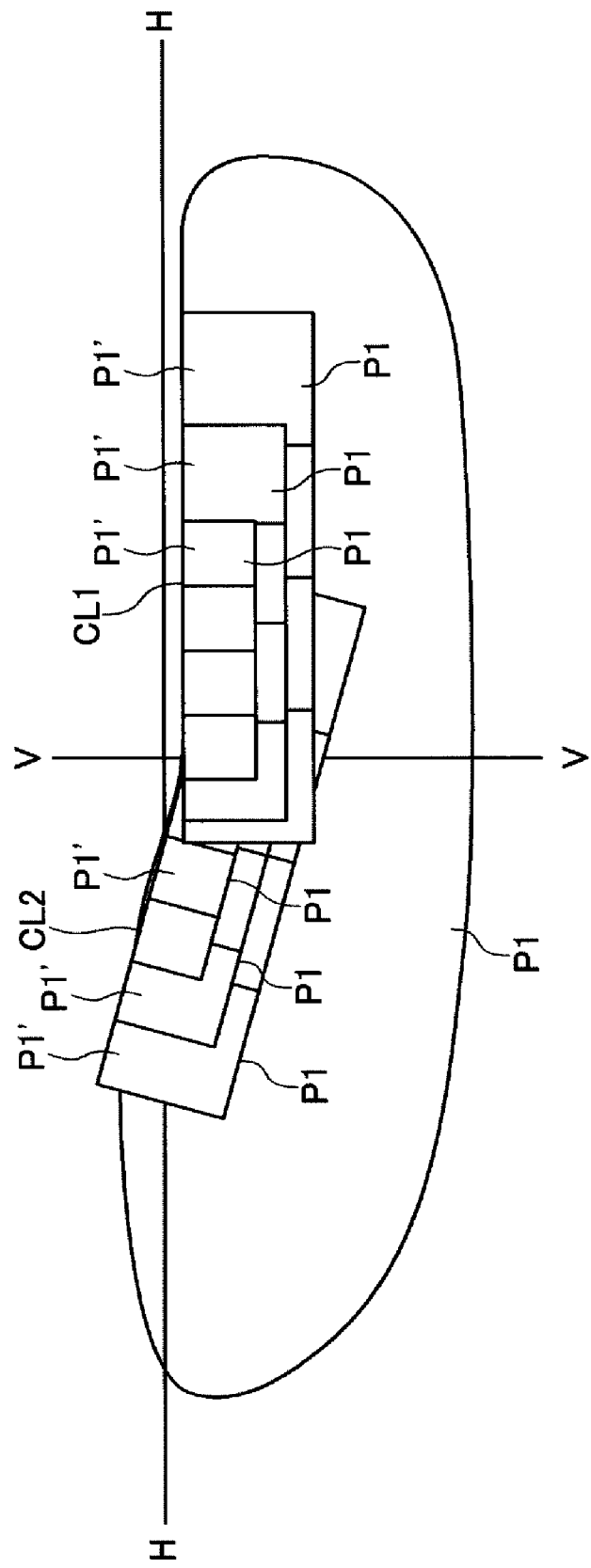

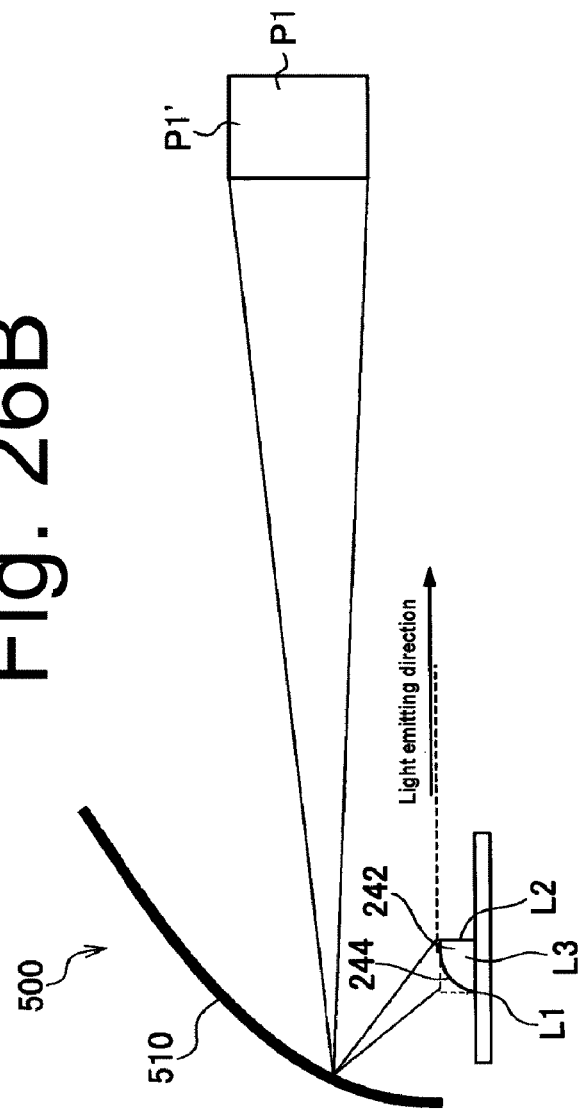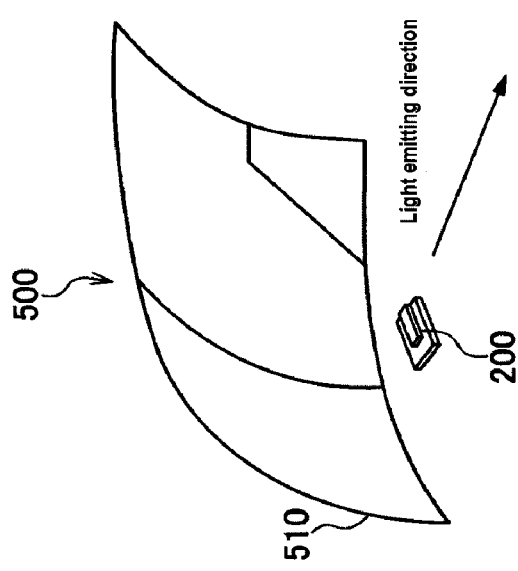

VEHICLE LIGHT AND ROAD ILLUMINATION DEVICE

This application claims the priority benefit under 35 U.S.C. §119 of Japanese Patent Application No. 2009-071954 filed on Mar. 24, 2009, and this application also claims priority benefit under 35 U.S.C. §120 and is a continuation-in-part of U.S. patent application Ser. No. 12/577,714 filed on Oct. 12, 2009, which are both hereby incorporated in their entireties by reference.

TECHNICAL FIELD

The presently disclosed subject matter relates to a vehicle light and a road illumination device. In particular, the presently disclosed subject matter relates to a vehicle light and a road illumination device that utilizes a semiconductor light emitting device that can form a clear cutoff line in its light distribution pattern.

BACKGROUND ART

Conventionally, in the technical field of vehicle lights various semiconductor light emitting devices have been utilized, as disclosed in, for example, Japanese Patent Application Laid-Open Nos. 2005-322923, 2008-507805 and the like. Such semiconductor light emitting devices can have a light emitting diode chip and a wavelength conversion layer formed on the surface of the light emitting diode chip with a uniform thickness. FIGS. 1 and 2 show one example of a conventional semiconductor light emitting device having a light emitting diode chip Cp and a wavelength conversion layer Ly formed on the surface of the chip with a substantially uniform thickness. As the semiconductor light emitting device described in Japanese Patent Application Laid-Open No. 2005-322923 has the wavelength conversion layer with a uniform thickness, the luminance distribution thereof takes its maximum value at and near the chip center (around its optical axis) and gradually reduced values toward the periphery thereof (see FIG. 3). This is a similar phenomenon to the Lambertian distribution for surface light emission, and can be explained as a phenomenon in accordance with the COS function wherein, if in-plane luminance distribution is uniform, the center area shows the maximum value.

In the technical field of, in particular, vehicle headlights, the maximum value in the luminance distribution of a vehicle headlight is required to be arranged at or near the cutoff line in order to form a clear cutoff line. To comply with this requirement, a shade or the like shielding member must be utilized to cut the half of the luminance distribution as shown in FIG. 4. When the configuration including such a shade is employed, the light at the maximum value in the luminance distribution cannot be utilized, thereby reducing the light utilization efficiency.

SUMMARY

The presently disclosed subject matter was devised in view of these and other characteristics, features, and problems and in association with the conventional art. According to an aspect of the presently disclosed subject matter, a vehicle light and a road illumination device can be provided that utilize a semiconductor light emitting device capable of forming a luminance distribution where the light with a maximum value can be arranged at or near the cutoff line, thereby improving light utilization efficiency.

According to another aspect of the presently disclosed subject matter, a vehicle light can include a semiconductor light emitting device including a semiconductor light emitting element having a light emitting surface and a wavelength conversion layer configured to cover the light emitting surface of the semiconductor light emitting element, the wavelength conversion layer having a thickness-decreased portion that is formed from or from around a center line of the light emitting surface to one end of the semiconductor light emitting element so that the thickness thereof is reduced from or from around the center portion toward the one end of the semiconductor light emitting element. The vehicle light can further include a projection optical system configured to form a cutoff line including at least one of a horizontal cutoff line and an oblique cutoff line in a light distribution, by projecting a plurality of light source images each including an image portion corresponding to the thickness-decreased portion at its upper area, and arranging the image portions in at least one of a horizontal direction and an oblique direction.

The thickness-decreased portion can have a high luminance when compared with those in a conventional vehicle light. Accordingly, the vehicle light with the above configuration can form a light distribution pattern for a low beam, the light distribution pattern having a significantly clearer cutoff line than that obtained by a conventional vehicle light. Note that the clearer cutoff line includes at least one of the horizontal cutoff line and the oblique cutoff line. Namely, it is possible to provide a vehicle light utilizing a semiconductor light emitting device which can form a luminance distribution where the light with a maximum value can be arranged at or near the cutoff line.

In the above configured vehicle light, the projection optical system can include a reflecting surface, and the semiconductor light emitting device can be disposed such that the thickness-decreased portion is disposed on a farther side from the reflecting surface and a light emitting direction of the semiconductor light emitting device is directed downward, while the reflecting surface can be disposed in the light emitting direction of the semiconductor light emitting device. In this case, the reflecting surface can be configured such that the plurality of light source images each including the image portion corresponding to the thickness-decreased portion at the upper area thereof are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light. The vehicle light with the above configuration can also form a luminance distribution where the light with a maximum value can be arranged at or near the cutoff line.

Alternatively, in the above configured vehicle light, the projection optical system can include a reflecting surface, and the semiconductor light emitting device can be disposed such that the thickness-decreased portion is disposed on a nearer side to the reflecting surface and a light emitting direction of the semiconductor light emitting device is directed upward, while the reflecting surface can be disposed in the light emitting direction of the semiconductor light emitting device. In this case, the reflecting surface can be configured such that the plurality of light source images each including the image portion corresponding to the thickness-decreased portion at the upper area thereof are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light. The vehicle light with the above configuration can also form a luminance distribution where the light with a maximum value can be arranged at or near the cutoff line.

Alternatively, in the above configured vehicle light, the projection optical system can include a reflecting surface, and the semiconductor light emitting device can be disposed such that the thickness-decreased portion is disposed on the lower side of the device and a light emitting direction of the semiconductor light emitting device is set horizontally, while the reflecting surface can be disposed in the light emitting direction of the semiconductor light emitting device. In this case, the reflecting surface can be configured such that the plurality of light source images each including the image portion corresponding to the thickness-decreased portion at the upper area thereof are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light. The vehicle light with the above configuration can also form a luminance distribution where the light with a maximum value can be arranged at or near the cutoff line.

Alternatively, in the above configured vehicle light, the projection optical system can include a reflecting surface, a shade, and a projection lens, and the semiconductor light emitting device can be disposed such that the thickness-decreased portion is disposed on a farther side from the reflecting surface and a light emitting direction of the semiconductor light emitting device is directed upward, while the reflecting surface can be disposed in the light emitting direction of the semiconductor light emitting device. In this case, the reflecting surface can be configured such that the plurality of light source images each including the image portion corresponding to the thickness-decreased portion at the upper area thereof are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light. The vehicle light with the above configuration can also form a luminance distribution where the light with a maximum value can be arranged at or near the cutoff line.

Alternatively, in the above configured vehicle light, the projection optical system can include a projection lens, and the semiconductor light emitting device can be disposed such that the thickness-decreased portion is disposed on a nearer side to the projection lens and on the lower side of the device. In this case, the projection lens can be configured such that the plurality of light source images each including the image portion corresponding to the thickness-decreased portion at the upper area thereof are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light. The vehicle light with the above configuration can also form a luminance distribution where the light with a maximum value can be arranged at or near the cutoff line.

According to still another aspect of the presently disclosed subject matter, a road illumination device can include a semiconductor light emitting device including a semiconductor light emitting element having a light emitting surface and a light emitting direction, and a wavelength conversion layer configured to cover the light emitting surface of the semiconductor light emitting element, the wavelength conversion layer having a thickness-decreased portion and a thickness-uniform portion, the thickness-decreased portion being formed from or from around a center line of the light emitting surface to one end of the semiconductor light emitting element so that the thickness thereof is reduced from or from around the center portion toward the one end of the semiconductor light emitting element, the thickness-uniform portion being formed from or from around the center portion to the other end of the semiconductor light emitting element. The vehicle light can further include a reflecting surface disposed in the light emitting direction of the semiconductor light emitting device. The illumination device can be configured such that a light source image corresponding to the thickness-decreased portion is arranged along a light/dark border line of an illumination region of the road illumination device.

In the above configured illumination device, the wavelength conversion layer can have the thickness-uniform portion and the thickness-reduced portion, so that the cross-section thereof is asymmetric. Accordingly, it is possible to provide a road illumination device utilizing a semiconductor light emitting device having a novel luminance distribution (see FIG. 20) which is absolutely different from the conventional light emitting device.

In the above illumination device of the presently disclosed subject matter, the luminance distribution along its longitudinal cross section of the semiconductor light emitting element can have a gradation with an abrupt rising from the end of the thickness-decreased portion and gradually decreased over the thickness-uniform portion. This can provide a road illumination device utilizing the semiconductor light emitting device best for forming an appropriate light distribution pattern.

According to the presently disclosed subject matter, it is possible to provide a vehicle light and a road illumination device utilizing a semiconductor light emitting device which can form a luminance distribution where the light with a maximum value can be arranged at or near the cutoff line.

BRIEF DESCRIPTION OF DRAWINGS

These and other characteristics, features, and advantages of the presently disclosed subject matter will become clear from the following description with reference to the accompanying drawings, wherein:

FIG. 3 is a graph showing a luminance distribution along a chip cross section of a conventional semiconductor light emitting device;

FIG. 4 is a set of graphs illustrating a problem in association with a conventional semiconductor light emitting device;

FIG. 6A is a cross sectional view taken along line A-A' in FIG. 5A, illustrating a process step in the method for producing the semiconductor light emitting device of the first exemplary embodiment showing the case just after the coating film of the wavelength conversion layer material is formed, and FIG. 6B is a cross sectional view taken along line A-A' in FIG. 5A, illustrating the semiconductor light emitting device of the first exemplary embodiment showing the case where the coating film is cured to form the wavelength conversion layer;

FIG. 7A includes diagrams illustrating the bridge portion of FIG. 5 formed by coating a resin material in a cylindrical shape, shaping the ends thereof to be rounded, and then curing the resin material, FIG. 7B includes diagrams illustrating another embodiment of the bridge portion of FIG. 5 formed by coating a resin material in an elliptic cylindrical shape, shaping the ends thereof to be rounded, and then curing the resin material, and FIG. 7C includes diagrams illustrating still another embodiment of the bridge portion formed in a triangular prism shape;

FIG. 9 is a cross sectional view of a light emitting element 102 of the semiconductor light emitting device of FIG. 5A;

FIGS. 10A, 10B, and 10C are each top plan views and side views of the semiconductor light emitting device of the first exemplary embodiment in the respective producing method;

FIG. 13A is a side view illustrating the bridge portion that has been separately produced for use in the present exemplary embodiment, FIG. 13B includes a perspective view and a cross sectional view illustrating another embodiment of the separately produced bridge portion in a parallelepiped prism or rectangular prism, FIG. 13C includes a perspective view and a cross sectional view illustrating still another embodiment of the separately produced bridge portion in a triangular prism, and FIG. 13D includes a perspective view and a cross sectional view illustrating still further another embodiment of the separately produced bridge portion in a semi-cylindrical shape;

FIG. 19A is a top plan view of a semiconductor light emitting device 200 of a fourth exemplary embodiment made in accordance with principles of the presently disclosed subject matter, FIG. 19B is a front view of the same, and FIG. 19C is a side view of the same;

FIG. 22A is a top plan view of a semiconductor light emitting device 300 of a fifth exemplary embodiment made in accordance with principles of the presently disclosed subject matter, FIG. 22B is a front view of the same, and FIG. 22C is a side view of the same;

FIG. 25 is a diagram illustrating a light distribution pattern for describing a cutoff line formed by the vehicle light according to any of the sixth to tenth exemplary embodiments;

FIG. 26A is a perspective view of a vehicle light 500 of a seventh exemplary embodiment made in accordance with principles of the presently disclosed subject matter, and FIG. 26B is a longitudinal cross sectional view of the same;

DESCRIPTION OF EXEMPLARY EMBODIMENTS

A description will now be made below to semiconductor light emitting devices of the presently disclosed subject matter with reference to the accompanying drawings in accordance with exemplary embodiments.

It should be noted that the present exemplary embodiments will deal with, as non-limiting examples, the cases of white light emitting devices where a plurality of blue light emitting elements (blue LEDs) are arranged in line and a wavelength conversion layer containing a phosphor as a wavelength conversion material are used in combination. Herein, the phosphor can wavelength convert blue light which acts as an excitation light to yellowish orange light that is to be emitted, thereby producing white light by the mixture of blue light and yellowish orange light. It should be noted that the color combination and the color of the finally emitted light are not limited to the following exemplary embodiments, and the presently disclosed subject matter can employ various combinations of color achieved by various combinations of semiconductor light emitting elements and wavelength conversion materials.

It should also be noted that the main emission direction of light is defined as an upper direction or front direction in some cases, and based on this the down and horizontal directions and so on are defined accordingly.

<First Exemplary Embodiment>

Figure 5A:
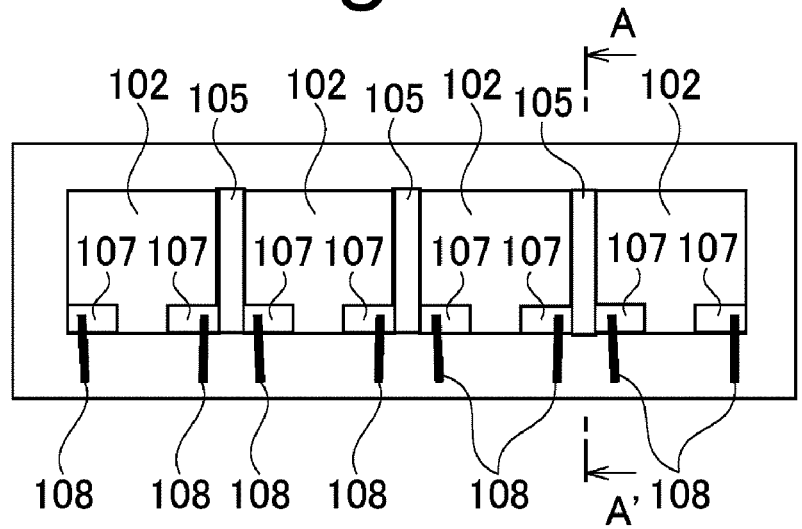
FIG. 5A is a top plan view of a semiconductor light emitting device of a first exemplary embodiment made in accordance with principles of the presently disclosed subject matter.
Figure 5B:
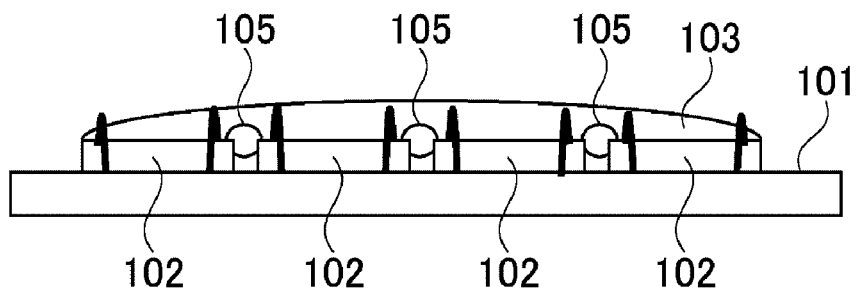
FIG. 5B is a side view of the semiconductor light emitting device.

FIGS. 5A and 5B illustrate a semiconductor light emitting device of a first exemplary embodiment, FIG. 5A being a top plan view of the semiconductor light emitting device and 5B being a side view thereof. The semiconductor light emitting device 100 of the first exemplary embodiment can have four light emitting elements (LED chips) 102 disposed on a single substrate 101 at predetermined intervals. Bridge portions 105 can be disposed between the adjacent light emitting elements 102, so that the intervals are covered therewith. Furthermore, a wavelength conversion layer 103 can cover the entire top surfaces of the four light emitting elements 102 and the bridge portions 105.

Each of the four light emitting elements 102 can be formed of an LED chip having a top surface as a light emitting surface for emitting blue light in the upward direction (front direction). The wavelength conversion layer 103 can be formed of a resin layer in which phosphor particles as a wavelength conversion material are dispersed. The phosphor can wavelength convert blue light as excitation light to emit yellowish orange fluorescence light. The phosphor particles may be YAG type phosphor particles as an example. The light emitting element 102 can have electrodes (wire bonding pads) 107 formed on the top surface thereof. The four light emitting elements 102 can be disposed so that the electrodes 107 having the same polarity face upward. Then, the electrodes 107 can be wire bonded on the substrate 101 by bonding wires 108. On the other surfaces of the four light emitting elements 102 not-shown paired electrodes with respect to the electrodes 107 on the top surface can be formed. The paired electrodes can be electrically connected to an electrode pattern formed on the substrate 101. The wavelength conversion layer 103 can be disposed so that the electrodes 107 and the bonding wires 108 can be embedded therein in part.

The four light emitting elements 102 can emit blue light in the upper direction (front direction) and then the blue light can pass through the wavelength conversion layer 103 provided on the top surfaces of the elements. Part of the blue light can excite the phosphor contained in the wavelength conversion layer 103 so that the phosphor can emit yellowish orange colored fluorescence light. The blue light having passed through the wavelength conversion layer 103 and the generated yellowish orange colored fluorescence light can be mixed together, so that white light can be projected from the wavelength conversion layer 103 upward.

The wavelength conversion layer 103 can have a thickness as shown in the side view and the A-A' cross sectional view of FIGS. 5B and 6B. The thickness is decreased toward the peripheral area to be the minimum thickness at both the ends while it is increased toward the center area. In particular, the wavelength conversion layer 103 can have a shape without any end surface perpendicular to the main plane (or the top surface of the element 102). In other words, the wavelength conversion layer 103 can cover the connected four light emitting elements and can have the thickness being substantially zero at the outer peripheral area of the top surface. In this case, emission of light from the wavelength conversion layer 103 in the lateral direction or toward the substrate 101 can be prevented. In the conventional art, light can be emitted from the end surface of the wavelength conversion layer. Such light can be reflected by its surroundings to its front direction, thereby blurring the front luminance distribution at the interface between the light emitting area and the surrounding non-emission area (outer environment). The configuration of the presently disclosed subject matter, however, can prevent such light from being emitted toward its surroundings, thereby achieving the sharp difference of front (top face) luminance distribution between the light emitting area and the surrounding non-emission area (outer environment). Furthermore, as the wavelength conversion layer 103 has its thickness decreased toward the peripheral area, the light emitted from the wavelength conversion layer 103 can be directed upward in the front direction, thereby enhancing the sharp difference of the front luminance distribution between the light emitting area and the surrounding non-emission area.

In the present exemplary embodiment, the top surface of the wavelength conversion layer 103 can be formed in a convex curved surface in the front direction. Accordingly, the wavelength conversion layer 103 can have a continuous curved surface from the center to the ends covering the connected light emitting elements 102. In other words, the wavelength conversion layer 103 can avoid having any end faces perpendicular to the main plane, and can have a continuously variable thickness from the center to both the ends with the center portion being a topmost (i.e., apex) portion. This configuration can prevent light emitted from the wavelength conversion layer 103 from being directed laterally or toward the substrate 101. The light emitted from the wavelength conversion layer 103 upward can have a smoothened luminance distribution over the LED chips, thereby reducing the variation of the luminance distribution ascribable to the wavelength conversion layer 103.

It should be noted that the thickness of the wavelength conversion layer 103 does not need to be decreased (e.g., tapered) in its entirety, but can be decreased (e.g., tapered) at least around the peripheral area of the wavelength conversion layer 103. Accordingly, the surface of the wavelength conversion layer 103 at the center area may be completely flat (e.g., parallel to the top surface of the light emitting element).

The wavelength conversion layer 103 can be formed as a single layer over the four light emitting elements 102. When compared with the case where the four light emitting elements 102 each have the wavelength conversion layer 103, the wavelength conversion layer 103 can have a phosphor particle distribution with less localization of the phosphor particles, thereby preventing the light color unevenness and the luminance unevenness.

The wavelength conversion layer 103 can be formed as a single layer over the entire surface of the connected four light emitting elements 102. As a result, the upper surface of the wavelength conversion layer 103 can be rectangular with four corners. In contrast, if the four light emitting elements 102 each have a wavelength conversion layer, the number of corners is 16 (4 by 4). Accordingly, the configuration of the presently disclosed subject matter can reduce the number of corners. When the thickness of a wavelength conversion layer is decreased (e.g. tapered) at the peripheral areas and also at the corners, the light emitted there can have a bluish white color because of a reduced amount of phosphor provided there. The configuration of the presently disclosed subject matter can employ the single wavelength conversion layer for covering the four light emitting elements 102 entirely, and the number of corners can be reduced, thereby suppressing the light color unevenness.

The method for forming the wavelength conversion layer 103 with such a shape is not specifically limited, and any method(s) suitable for this purpose can be employed. One method used in the present exemplary embodiment can include preparing a mixed liquid material for the wavelength conversion layer 103, dropping the mixed liquid material onto the four light emitting elements 102 connected via the bridge portions 105 while keeping its convex shape due to the surface tension, and curing it as it is. As a result, the wavelength conversion layer 103 can be easily formed with a shape having a gradually decreased thickness toward the peripheral areas.

Figure 5C:
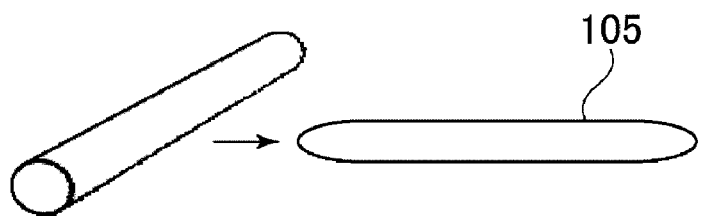
FIG. 5C is a diagram illustrating the bridge portion showing the case where it is just coated (as a perspective view) and the case where it is cured (as a side view)

In order to form the wavelength conversion layer 103 utilizing the surface tension of the mixed liquid material, the bridge portion 105 can be shaped to have certain shapes as well as certain end shapes by maintaining the surface tension of the mixed liquid material on the bridge portions 105 after it has been dropped onto the light emitting elements 102. For example, the bridge portion 105 can have a circular cross section as shown in FIGS. 5C and 7A and the ends 121 in the lengthwise direction can be rounded so that the bridge portion 105 does not have any sharp end surface. Accordingly, as shown in FIG. 6A, the tips of the ends 121 can be disposed on the same plane as the top surface of the end of the light emitting elements 102. In an alternative exemplary embodiment, the end 121 can be rounded to have an elliptic cross section as shown in FIG. 7B. This type of the bridge portion 105 can be disposed in the same way as the portion 105 having the circular cross section. In another alternative exemplary embodiment, the bridge portion 105 can have an end face 122 triangular in shape as shown in FIG. 7C or rectangular in shape (being a triangular prism or rectangular prism). In this case, the bottom side 122a of the end face 122 (side near the substrate 101) can be configured to be disposed on the same plane as the top surface of the light emitting element 102. By doing so, the surface tension of the same level can be generated at the end of the light emitting element 102 and at the end of the bridge portion 105 when dropping the mixed liquid material for the wavelength conversion layer 103. Accordingly, the convex shape of the mixed liquid material can be kept due to the surface tension across the four light emitting elements 102 connected via the bridge portions 105.

After the convex shape of the mixed liquid material is completed, the coating film 123 of the mixed liquid material can be formed as shown in FIG. 6A. The formed coating film 123 can be cured to form the domed wavelength conversion layer 103 with the thickness being continuously varied as shown in FIG. 6B and without a perpendicular end surface.

Figure 8A:
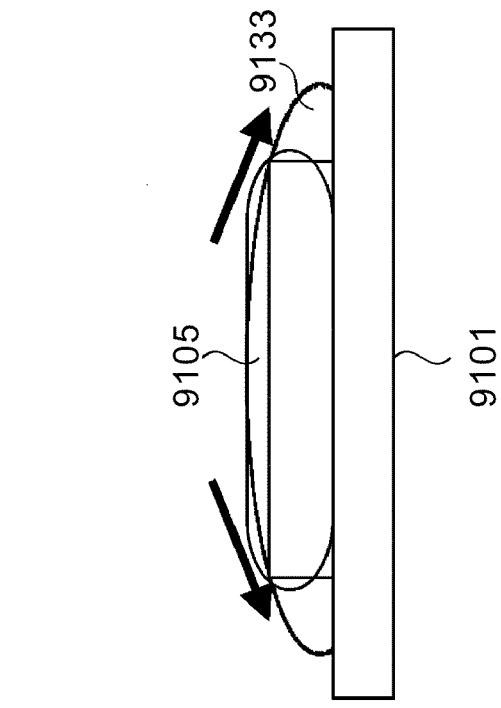
FIG. 8A is a cross sectional view illustrating a process step in a method for producing a conventional semiconductor light emitting device, showing the case, when the ends of the bridge portion 9105 are located below the top surface of the light emitting element, the material for the wavelength conversion layer being dropped onto the top surface of the light emitting element.
Figure 8B:
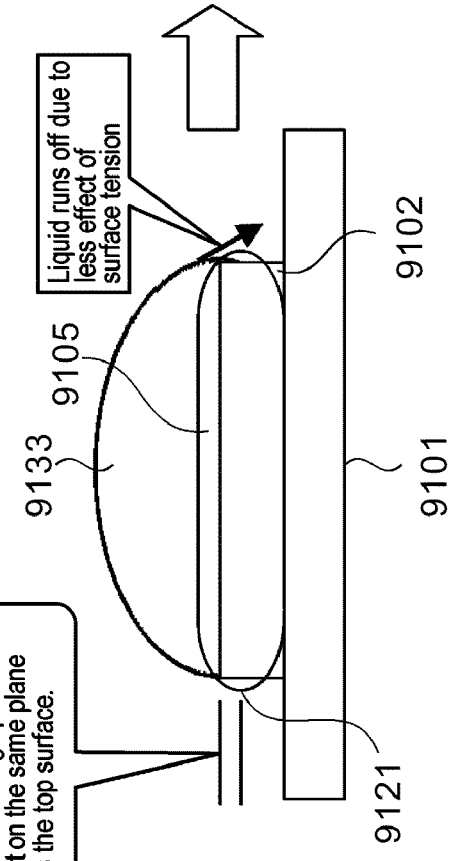
FIG. 8B is a cross sectional view of the device of FIG. 8A illustrating the case where the dropped material for the wavelength conversion layer has run off from the ends of the bridge portion.

By contrast, as shown in FIG. 8A, if the ends 9121 of the bridge portion 9105 is positioned below the top surface of the end of the light emitting element 9102 so that the ends 9121 are not disposed on the same plane as the top surface of the light emitting element 9102, the surface tension acting at the ends of the light emitting element 9102 cannot be kept at the ends of the bridge portion 9105. Although the mixed liquid material 9133 dropped onto the light emitting element 9102 can be shaped into a convex surface due to the surface tension on the light emitting element 9102, the surface tension cannot be kept at the ends of the bridge portion 9105. As a result, the mixed liquid material 9133 may run off from the ends of the bridge portion 9105 onto the substrate 9101, as shown in FIG. 8B. Accordingly, any stable coating film of the mixed liquid material cannot be formed.

The shape of the bridge portion 105 is not limited to the shapes shown in FIGS. 7A, 7B and 7C, and any shape that can keep the generated surface tension of the dropped mixed liquid material at its ends can be used.

The method for producing the bridge portion 105 can be a method of disposing a separately prepared member at an appropriate position, a method of directly coating a material between the light emitting elements 102, or other methods. In the exemplary embodiment, a method of coating or printing a resin material of the bridge portion directly between the light emitting elements 102 while the resin material is controlled in fluidity can be used. This method can form the bridge portion 105 with its ends 121 or end sides 122a of the end surfaces 122 being disposed on the same plane as the top surface of the ends of the light emitting element 102. Examples of the method for forming the bridge portion 105 can include, but are not limited to, a dispenser coating process, a screen printing process, a stencil printing process, and the like.

Figure 1:
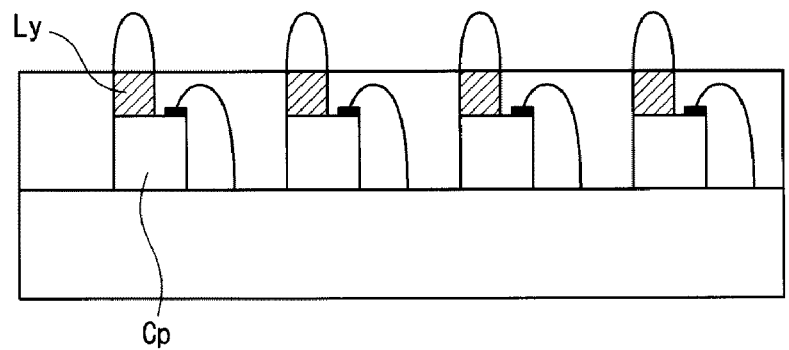
FIG. 1 is a side view illustrating a conventional semiconductor light emitting device.

A description will now be made to the method for manufacturing a semiconductor light emitting device of the present exemplary embodiment. Herein, the shape of the bridge portion 105 is exemplified as to have a circular cross section and rounded ends 121 as shown in FIGS. 1C and 3A.

The light emitting elements 102 can be prepared in advance, as illustrated in FIG. 9. The light emitting element 102 can have a structure in which a thin semiconductor light emitting layer 1021 having a thickness of several microns is formed on a conductive opaque substrate 1022 such as a silicon or germanium substrate. Between the light emitting layer 1021 and the opaque substrate 1022 a reflective layer 1023 such as silver or aluminum can be disposed so that almost all the light emitted from the light emitting layer 1021 can be projected in the front direction (upward) of the element. This type of light emitting element 102 can have a front light projection density to enhance its luminance when compared with the case where a semiconductor light emitting layer is provided on a transparent sapphire substrate which is generally used.

The thin film semiconductor light emitting layer 1021 can be formed to have a smaller size than the conductor opaque substrate 1022 in a plan view. This is because, when the light emitting element 102 is separated from a wafer including a plurality of elements 102 by dicing or scribing, the cleavage of the semiconductor light emitting layer 1021 and the associated damage of the interface can be prevented. Accordingly, a non-emission portion with a constant width "a" can exist on the top surface of the substrate 1022 and around the outer peripheral area of the light emitting layer as shown in FIG. 9.

The substrate 101 may be a ceramic substrate having an electrode wiring pattern formed in advance on its surface. As shown in FIG. 10A, four light emitting elements 102 can be disposed in line at predetermined intervals on the substrate 101. Not shown common bonding material can be used for fixing the elements 102 on mounting areas of the substrate 101. Then, the electrodes 107 on the top surfaces of the light emitting elements 102 can be bonded to the electrodes of the ceramic substrate 101 by gold wire 108 or the like, thereby electrically connecting the electrode wiring pattern of the substrate 101 to the light emitting elements 102.

Then, the bridge portions 105 can be formed between the light emitting elements 102 as shown in FIG. 10B. The material for the bridge portion 105 can be selected from materials having heat resistance and stress resistance, such as, but not limited to, thermosetting resins, RTV rubbers, and the like. The bridge portion 105 can be formed so as to linearly fit the interval between the adjacent light emitting elements 102, thereby allowing the entire side surfaces of the four light emitting elements 102 to be continuous. Examples of the thermosetting resins for the material of the bridge portion 105 can include, but are not limited to, silicone resins, epoxy resins, phenol resins, polyimide resins, melamine resins, and the like. In addition, the resin material can be mixed with a filler such, but not limited to, as titanium oxide, alumina, or the like to impart a light reflecting property to the bridge portion 105. This can enhance the light utilization efficiency.

When employing a thermosetting resin, the bridge portion 105 can be formed by a dispenser coating process, a screen printing process or a stencil printing process. When it is formed by a dispenser coating process, the wire bonding process can be carried out before the formation of the bridge portion 105. This method can achieve the wire bonding before the thermosetting resin material for the bridge portion 105 adheres to the electrode (wire bonding pad) 107. This can eliminate a need for a masking and the like for the electrode 107. This can improve the reliability of the bonding portions.

On the other hand, when it is formed by a screen or stencil printing process, a mask alignment process for printing can be taken into consideration and the wire bonding process can be carried out after the formation of the bridge portion. The printing process should be carried out while the thermosetting resin material for the bridge portion 105 is prevented from adhering to the electrode 107. Depending on the position of the electrode 107, the bridge portion formation process and the wire bonding process can be carried out in any arbitrary order.

The width of the bridge portion 105 can be adjusted to be wider than the interval between the adjacent light emitting elements 102 and smaller than the interval between the elements 102 plus twice the width "a" of the non-emission portion of the element 102 (see FIG. 5). The width of the bridge portion 105 greater than the above range may not be preferable because the bridge portion 105 may cover part of the light emitting layer 1021.

Furthermore, the bridge portion 105 can be formed so that the longitudinal ends 121 of the bridge portion 105 are disposed on the same plane as the top surface of the light emitting elements 102.

In order to form such a controlled end position and a width of the bridge portion 105, it may be necessary to control the fluidity of the resin material for the bridge portion 105. Specifically, the resin material can be mixed with a material for increasing the viscosity or imparting thixotropy (i.e., using thixotropic material), such as silica or alumina nano-particles, thereby allowing the resin material to have thixotropy for maintaining its shape for a long period of time after coating or printing. When the bridge portion 105 is formed by a dispenser coating process, a material having appropriate thixotropy can be extruded with the use of a nozzle having a predetermined diameter while the dropping amount is controlled. This process can provide a coating film having ends disposed at appropriate positions and a desired width. Specifically, the bridge portion 105 can be formed as a cylindrical resin material coating as shown in FIGS. 5C and 7A. The resin material can have certain thixotropy and fluidity, and accordingly, the coating can be rounded at its ends of the cylinder spontaneously after standing for a certain period of time. The tip shape of the end can be rounded as shown in FIGS. 5C and 7A. While this state is being kept, the material can be cured to form the bridge portion 105 having the ends disposed at the appropriate positions and with the desired width (see FIG. 6A).

Specifically, the nozzle diameter can be set to the value equal to or greater than the interval between the adjacent light emitting elements 102 and smaller than the interval between the elements 102 plus twice the width "a" of the non-emission portion of the element 102. This configuration can provide the bridge portion 105 with the width within the predetermined range as described above.

Figure 2:
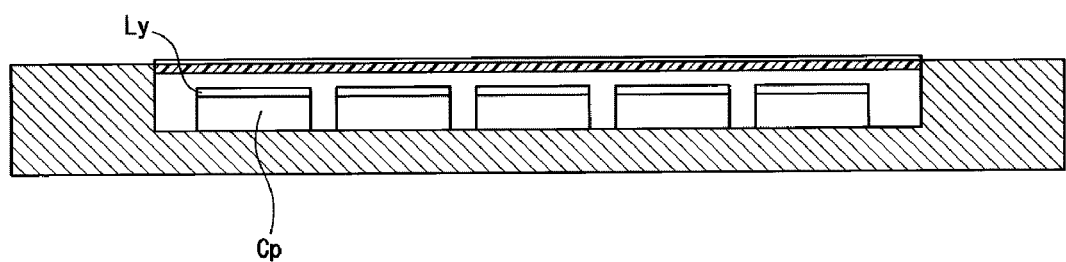
FIG. 2 is a cross sectional view of the conventional semiconductor light emitting device.

As the bridge portion 105 is formed so that the ends coincide with the top surface of the elements 102, a space can be formed between the bridge portion 105 and the substrate 101 below the bridge potion 105 as shown in FIG. 2B.

Next, the wavelength conversion layer 103 can be formed (see FIG. 10C). For example, particles of a YAG type phosphor can be dispersed in a silicone resin material to form a mixed liquid material and the liquid can be dropped by a dispenser or the like. The ends 121 of the bridge portion 105 can be formed on the same plane as the top surface of the light emitting element 102. Accordingly, the generated surface tension can be kept at the periphery of the light emitting elements 102 and the ends of the bridge portion 105. Thus, the convex shape of the mixed liquid material can be formed as the coating film as shown in FIG. 6A. In this case, the coating film can be a single rectangular film covering the four light emitting elements 102 and the bridge portions 105 entirely. Namely, the coating film can be continuous over the four light emitting elements 102 and the bridge portions 105. Because of this, the surface concavity and convexity of the coating film can be leveled and can have a curved shape in accordance with the coated amount. Furthermore, the coating film can be formed as a single film. This can realize the uniform phosphor concentration above the respective light emitting elements 102. The thus formed shape of the coating film can be kept and cured to be formed into the wavelength conversion layer 103.

The wavelength conversion layer 103 can be formed without any end surface perpendicular to the main plane and has thinned peripheral areas. Accordingly, the semiconductor light emitting device of the present exemplary embodiment can have a front luminance distribution having a sharp difference between the light emitting area and the surrounding non-emission area. Furthermore, as the wavelength conversion layer 103 can be formed as a single layer as a whole, the phosphor concentration above the respective light emitting elements can be evened with less light color unevenness and luminance unevenness. In addition to this, as the wavelength conversion layer 103 can be limited to four corners over the area of the four light emitting elements 102, the layer 103 can be prevented from having light color unevenness and luminance unevenness due to a lot of corners.

<Second Exemplary Embodiment>

Figure 11A:
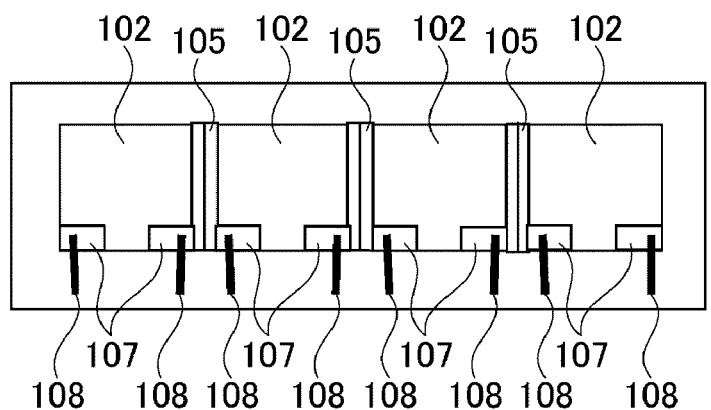
FIG. 11A is a top plan view of a semiconductor light emitting device of a second exemplary embodiment made in accordance with principles of the presently disclosed subject matter.
Figure 11B:
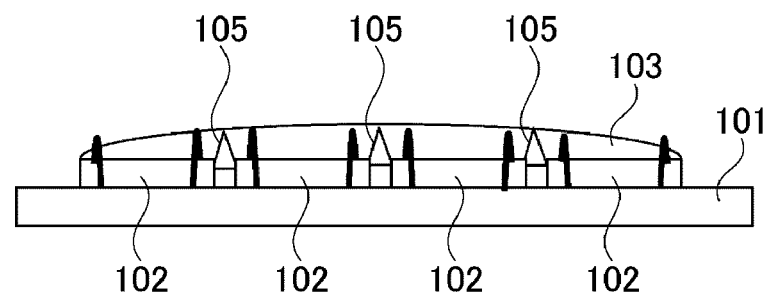
FIG. 11B is a side view of the same, and FIG. 11C includes perspective views of the bridge portion just after coating and just after leveling before curing.

With reference to FIGS. 11A and 11B, a description will be made to a semiconductor light emitting device of a second exemplary embodiment. The semiconductor light emitting device of the present exemplary embodiment can have a bridge portion 105 having inclined surfaces along its longitudinal directions as shown in FIGS. 7C and 11A and 11B (for example, having an isosceles triangular cross section). The lower side of the ends of the bridge portion 105 can be formed to be disposed on the same plane as the top surface of the light emitting element so as to keep the surface tension of the coating film as in the first exemplary embodiment. The other configuration can be formed in the same manner as in the first exemplary embodiment.

Figure 11C:
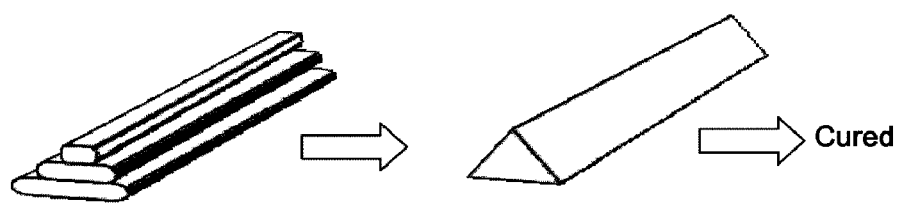

The bridge portion 105 having the shape as shown in FIGS. 7C, 11A and 11B can be formed by a process of coating a resin material having thixotropic property with the use of a dispenser as in the first exemplary embodiment and repeating the process. Specifically, the opening of the nozzle of the dispenser may be elliptic to form an elliptic cylindrical resin material. Then, the extrusion pressure and other factors can be adjusted to control the extruded amount of the resin material and the coating is repeated while the major axis of the ellipse is gradually reduced so that the coating materials are overlaid at the same position, as shown in FIG. 11C. Accordingly, the laminate of elliptic cylindrical resin material layer can be formed. In this state, the formed laminate can stand for a predetermined period of time, thereby allowing the respective layers of the laminate to be fused and leveled, as shown in FIG. 11C. This can unite the laminate to form the resin material having a triangular cross section.

The semiconductor light emitting device of the present exemplary embodiment, the bridge portion 105 can have the inclined surfaces at both sides along its longitudinal direction as shown in FIG. 11B. These inclined surfaces intersect one another at a apex and can slope downward from the apex. Accordingly, even when the light emitted from the light emitting elements 102 in the horizontally oblique directions, the light can be reflected by the inclined surfaces of the bridge portion 105, thereby allowing the light to be directed upward. This configuration can improve the front luminance.

When the resin material for the bridge portion 105 includes a reflecting material (filler) mixed therein, the reflection effect can be improved. Examples of the reflecting material can include, but are not limited to, titanium oxide, alumina, and the like.

<Third Exemplary Embodiment>

Figure 12:
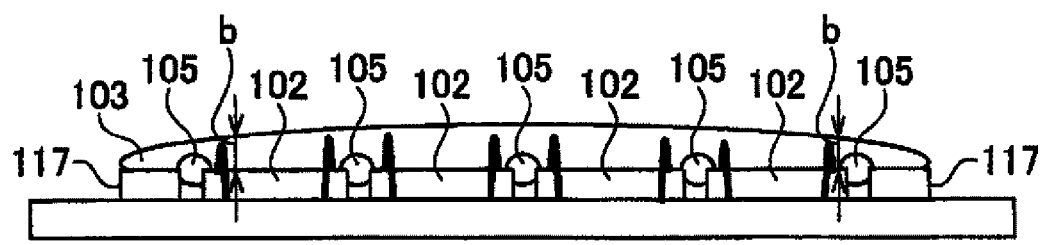
FIG. 12 is a side view of a semiconductor light emitting device of a third exemplary embodiment made in accordance with principles of the presently disclosed subject matter.

FIG. 12 is a side view illustrating the semiconductor light emitting device of a third exemplary embodiment made in accordance with the principles of the presently disclosed subject matter. The semiconductor light emitting device of FIG. 12 can include four light emitting elements 102 arranged in line and outmost pads 117 disposed on the respective outmost sides of the elements 102 in the arranged direction at predetermined intervals. Another bridge portion 105 can be disposed between the outermost pad 117 and the light emitting element 102 adjacent to the pad 117. The remaining components and structure can be the same as those of the first exemplary embodiment.

When the wavelength conversion layer 103 is formed, the mixed liquid material can be coated over the entire surface covering the four light emitting elements 102 and the outmost pads 117 so that the convex shape of the coated liquid can be kept due to the generated surface tension. Accordingly, the single wavelength conversion layer 103 can be formed with the thickness "b" at the ends of the outmost light emitting elements 102 being thicker when compared with the case of no outmost pad 117. This means the difference in thickness of the wavelength conversion layer above the four light emitting elements can be reduced when compared with the case of no outmost pad 117. This configuration can thus reduce the light color unevenness generated when the light is emitted through the wavelength conversion layer with different phosphor concentrations.

The height of the outermost pad 117 can be the same as that of the light emitting element 102. The ends and the outer peripheral areas of the light emitting elements 102 and the outmost pads 117 can be positioned on the same plane, so that the surface tension of the liquid material for the wavelength conversion layer can be kept. The width of the outermost pad 117 in the arranged direction can be equal to, or less than, the width of the light emitting element 102, and also can be equal to the width, or more than one half the width. If the width of the outermost pad 117 is less than one half the width, it might not be possible to maintain the surface tension of the liquid for the wavelength conversion layer. If it is more than the width of the light emitting element, the entire size of the apparatus may be too large. The upper surface of the outermost pad 117 may be rectangular or semi-circular. Particular applications can benefit from the semi-circle with the linear side adjacent to the light emitting element 102. This configuration can effectively keep the surface tension of the liquid for the wavelength conversion layer.

Materials of the outmost pad 117 can include, but are not limited to, a metal material, a ceramic material, a resin material or the like. Among them, metal with reflective silver plating or alumina can exhibit certain benefits because the pad can reflect the light from the light emitting element upward (in the front direction).

As described above, a semiconductor light emitting device made in accordance with the principles of the presently disclosed subject matter can include the bridge portions between the light emitting elements to connect the plurality of the light emitting elements, thereby facilitating the formation of the single wavelength conversion layer with a predetermined shape. Accordingly, it is possible to provide a light emitting device with a novel light emission shape that is formed by connecting the elements in a unit.

It should be noted that the present exemplary embodiments have dealt with the cases in which the four light emitting elements are connected in line. The presently disclosed subject matter, however, is not limited to these exemplary embodiments. The light emitting elements can be arranged two by two, three by three, a letter L-shaped arrangement, rectangular connected arrangement, or the like. In each of the embodiments, the bridge portions can be formed between adjacent elements.

It should be noted that the present exemplary embodiments have dealt with the cases in which the bridge members are formed by arranging a thixotropic resin material between the adjacent light emitting elements 102 by a dispenser coating process or a printing process, and then curing the resin material. The presently disclosed subject matter, however, is not limited to these processes. For example, the bridge portions 105 can be separately produced to have a predetermined shape, and then the already produced bridge portions 105 can be mounted between the light emitting elements 102. The bridge portions 105 can be produced by any suitable methods including, but not limited to, injection molding, laser processing, etching and the like. In this case, the bridge portion 105 can be produced to include a bridge main body 105a and a chip-insertion spacer 105b. The chip-insertion spacer 105b can support the bridge main body 105a and can be inserted in to the predetermined gap or interval between the light emitting elements 102. This configuration can ensure the fixing of the bridge portion 105. The length of the chip-insertion spacer 105b can be shorter than the main body 105a. Accordingly, there is no chip-insertion spacer just below the end surface 122 of the main body 105a so as to expose the bottom side 122a of the end surface 122. The shape of the bridge main body 105a can be any desired shape including, but not limited to, a rectangular prism, a triangular prism, a semi-cylindrical shape and the like, as shown in FIGS. 13B, 13C and 13D. The width of the bridge main body 105a can be set as in the previous exemplary embodiments. Specifically, it can be set at a value smaller than the predetermined interval between the elements 102 plus twice the width "a" of the non-emission portion of the element 102 (see FIG. 9). Accordingly, the bridge portion 105 of the present exemplary embodiment can be configured not to cover part of the light emitting layer 1021 (See FIG. 9).

As shown in FIGS. 13A to 13C, the bridge portion 105 can be produced in advance and the chip-insertion spacer 105b can be inserted in between the light emitting elements 102. This configuration can fix the bridge portion 105 between the light emitting elements 102. Accordingly, the bottom side 122a of the end surface 122 of the bridge main body 105a can be positioned on the same plane as the top surface of the light emitting element 102 at its end. This configuration can keep the surface tension of the liquid material for the wavelength conversion layer so that the convex shape of the wavelength conversion layer can be ensured.

As described above, the effects of the semiconductor light emitting device made in accordance with the principles of the presently disclosed subject matter can include:

(1) A plurality of light emitting elements that can be connected with the bridge portions disposed between the elements, and accordingly, a single wavelength conversion layer can be formed over them with a predetermined shape, thereby achieving the sharp difference of a front luminance distribution between the light emitting area and the surrounding non-emission area (outer environment);

(2) A wavelength conversion layer can be formed in a continuous fashion over the light emitting elements, the surface concavity and convexity can be leveled during coating, meaning that the wavelength conversion layer can be shaped depending on the coating amount and the resulting layer can have a uniform phosphor concentration above the respective light emitting elements, so that any light color unevenness and luminance unevenness can be improved;

(3) The wavelength conversion layer can have a continuous surface by the provision of the bridge portions, and it is therefore possible to provide a light emitting device with a novel light emission shape by the integrally formed wavelength conversion layer over the plurality of light emitting elements; and (4) When the wavelength conversion layer is formed by a dispenser coating method, the wire bonding process can be performed before coating and masking for electrodes (wire bonding pads) may not be required, thereby preventing the electrode contamination and providing improved reliability.

The semiconductor light emitting device of the present exemplary embodiments can be used as light sources for use in general lighting fixtures, street lamps, and various light emitting apparatuses, and particularly in vehicle lights and road illumination devices.

EXAMPLE

As an example, the semiconductor light emitting device having the configuration as described with reference to FIGS. 11A and 11B was produced.

Specifically, a ceramic substrate 101 having a wiring pattern formed thereon in advance was prepared. Four light emitting elements 102 were arranged in line on the ceramic substrate 101, and were fixed with a bonding material. The interval between the adjacent light emitting elements 102 was one tenth of the width L of the light emitting element in the arranging direction. A resin material for the bridge portion 105 was prepared by mixing a silicone resin with 15% of silica fine particles (Aerosil 380 manufactured by Nippon Aerosil Co., Ltd.) for imparting thixotropy to the material, and dispersing titanium oxide particles having a particle size of 0.2 to 0.4 µm as a reflecting filler in the resin. This resin material was dropped in between the light emitting elements 102 while the dropped amount thereof was controlled with the use of a nozzle having an elliptic opening shape with an opening diameter of 0.05 mm×0.15 mm. Then, the resin material was heated at 150° C. for 120 minutes for curing. By doing so, the bridge portions 105 were formed so as to be disposed on the substantially same plane as the top surface of the element at its ends as shown in FIG. 6A and have inclined surfaces along its longitudinal direction with the shape shown in FIG. 11B.

Then, respective ends of the wires 108 were bonded to the electrodes (wire bonding pads) 107 and the wiring pattern on the substrate 101, respectively, for electrical connection therebetween.

A liquid material for the wavelength conversion layer 103 was prepared by mixing a silicone resin with YAG phosphor particles having a particle size of 15 µm (in an amount of 23%). Then, a nozzle of a dispenser for the liquid material was scanned over the four light emitting elements 102 connected with the bridge portions 105 to drop the mixed liquid material over the four light emitting elements 102. The dropped mixed liquid material was configured to have a convex surface due to its surface tension so that a single coating film was formed to cover the four light emitting elements 102 entirely. The coating film was subjected to heat treatment at 50° C. for 90 minutes, and then again heat treatment at 150° C. for 120 minutes. As a result, the coating film was cured to complete the semiconductor light emitting device of the present example.

Figure 14A:
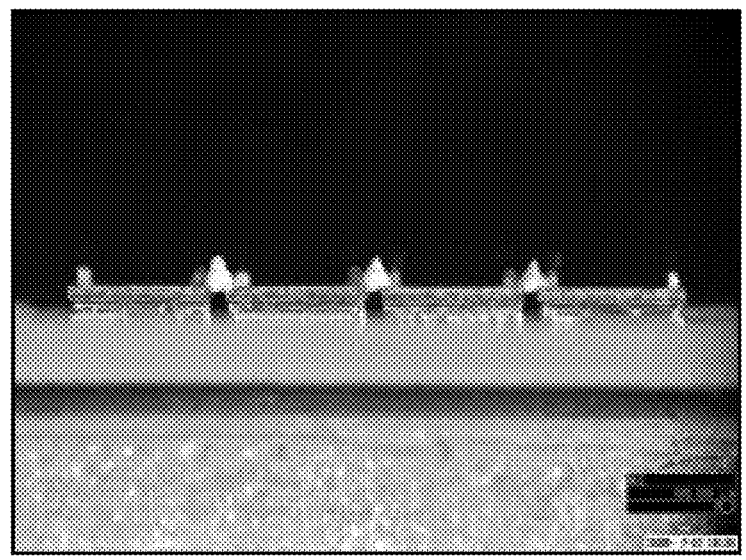
FIG. 14A is a photograph showing the side view of a semiconductor light emitting device of an exemplary embodiment just after the bridge portion has been formed.
Figure 14B:
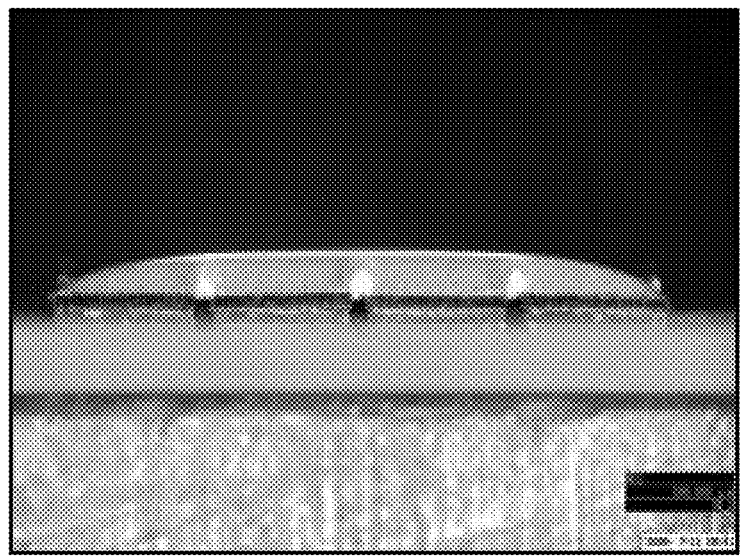
FIG. 14B is a photograph showing the side view of the semiconductor light emitting device just after the formation of the wavelength conversion layer.

FIGS. 14A and 14B are photographs showing the side surface of the semiconductor light emitting device of the present example. FIG. 14A is a photograph after the formation of the bridge portions 105 between the light emitting elements 102. As shown, the light emitting elements 102 are connected by the white resin (bridge portions 105). Furthermore, the photograph revealed that the bridge portion 105 had inclined surface on both sides.

FIG. 14B is a photograph after the wavelength conversion layer 103 covered the entire light emitting elements 102 connected. The photograph revealed that the wavelength conversion layer 103 had a convex curved surface near the center area as a maximum height due to the generated surface tension. Furthermore, the photograph revealed that both the ends of the layer 103 had reduced thicknesses, so that any end surfaces were produced at both the ends. Further, as shown, the wavelength conversion layer 103 had a symmetric shape.

As a comparative example 1, another semiconductor light emitting device was produced without a bridge portion 105 similar to the example above and resin layers containing phosphor particles were separately formed on respective top surfaces of the light emitting elements 102 by printing instead of the formation of a single wavelength conversion layer 103. In this comparative example, the semiconductor light emitting device had one electrode 107 formed on its top surface. As the wavelength conversion layer provided by printing was formed each light emitting element, when the elements were arranged, the independent four wavelength conversion layers were disposed at regular intervals in line. The formed wavelength conversion layer had a constant thickness due to printing method employed, it had end surfaces perpendicular to the top surface of the element.

Figure 15:
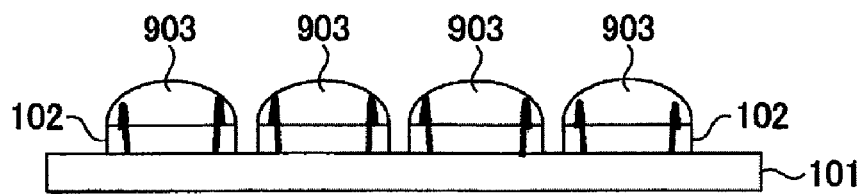
FIG. 15 is a side view of a semiconductor light emitting device of Comparative Example 2.

As a comparative example 2, another semiconductor light emitting device was produced as shown in FIG. 15. The semiconductor light emitting device of the comparative example 2 had no bridge portion 105 as shown in the drawing. Furthermore, the semiconductor light emitting device of the comparative example 2 had domed wavelength conversion layers 903 on the respective top surfaces of the four light emitting elements 102 by dropping the same mixed liquid material (containing the resin and phosphor particles) as in the example onto the top surfaces, so as to provide a convex surface due to its surface tension, and curing the resin. The configuration of the light emitting element 102 itself was the same as the example of the presently disclosed subject matter.

Figure 16:
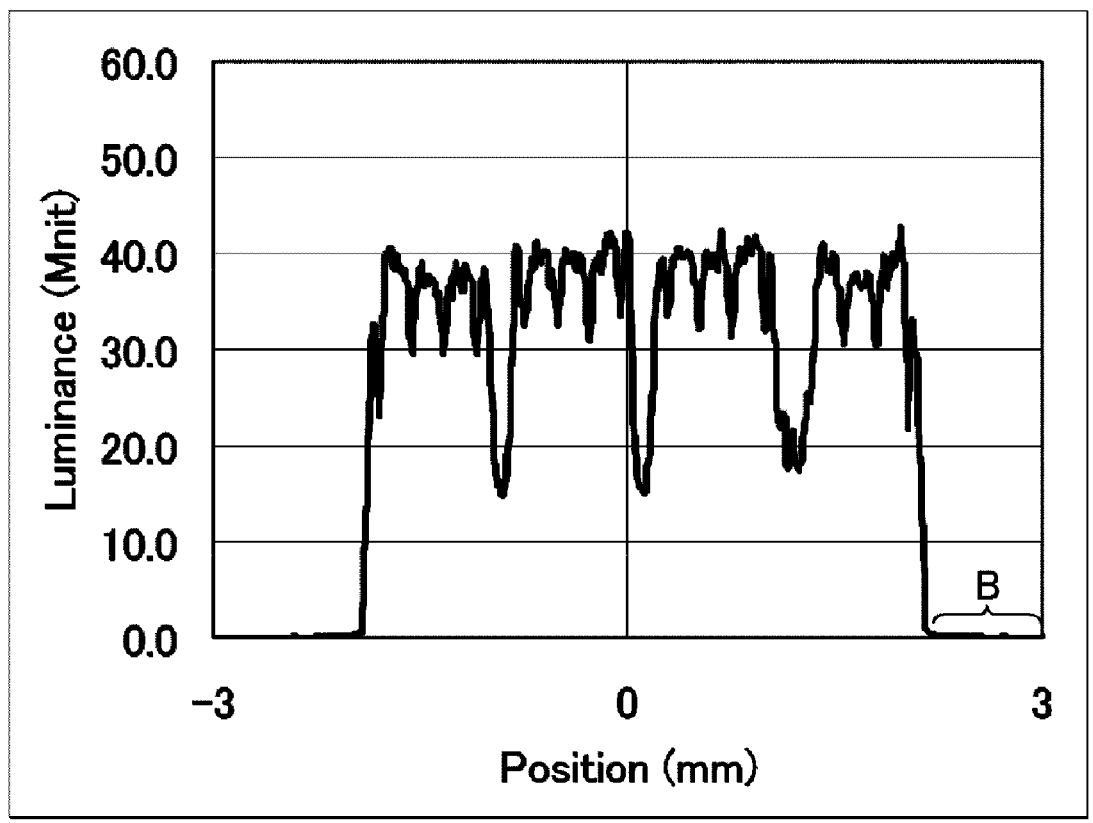
FIG. 16 is a graph showing the luminance distribution along the lateral direction of the semiconductor light emitting device of an exemplary embodiment (in the arranged line direction)
Figure 17:
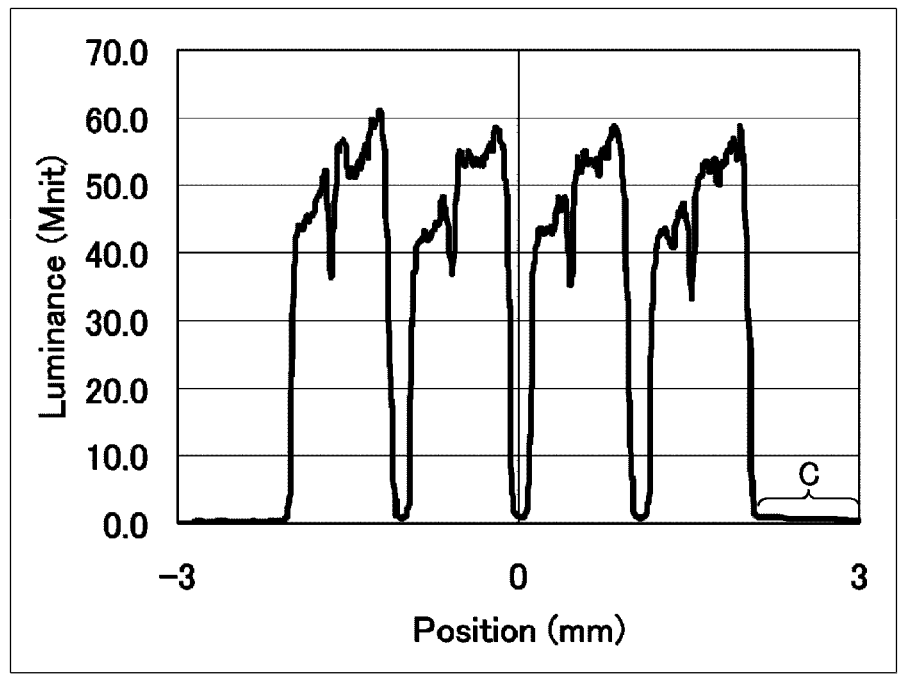
FIG. 17 is a graph showing the luminance distribution along the lateral direction of the semiconductor light emitting device of Comparative Example 1 (in the arranged line direction)
Figure 18:
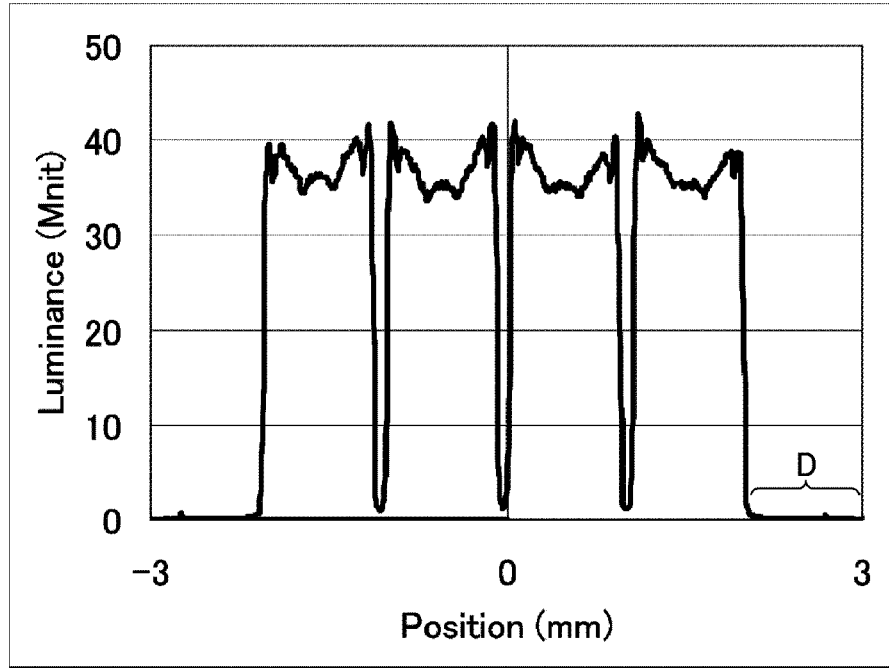
FIG. 18 is a graph showing the luminance distribution along the lateral direction of the semiconductor light emitting device of Comparative Example 2 (in the arranged line direction)

FIGS. 16, 17 and 18 are graphs showing the cross-sectional luminance distribution of each of the semiconductor light emitting devices of the example and the comparative examples 1 and 2 (along the cross section in the arranged line direction).

As shown in the luminance distribution of the semiconductor light emitting device of the comparative example 1 (FIG. 17), portions with low luminance (valleys) exist between the light emitting elements. The luminance at the valley was almost zero, so that the area does not project any light, meaning this portion was dark portion. In the comparative example 1, the phosphor layer formed by printing had the perpendicular end surfaces. Accordingly, the luminance distribution line at the non-light emission area C outside the elements was not flat (meaning the luminance is zero) at all or substantially flat, but was inclined (meaning some light were observed there).

The semiconductor light emitting device of the comparative example 2 had independent domed phosphor layers 903 on the respective elements. Accordingly, the luminance distribution of the semiconductor light emitting device of the comparative example 2 shown in FIG. 18 was flat at the non-light emission area D when compared with that at the non-light emission area C of the comparative example 1. Furthermore, the difference between the light emission area and non-light emission area in the luminance distribution line was sharp when compared with the case of comparative example 1. This means the improved effect could be obtain to some extent. However, as in the comparative example 1, portions with low luminance (valleys) exist between the light emitting elements. Accordingly, the luminance at the valley was almost zero, so that the area does not project any light, meaning this portion was dark portion. On the contrary, as shown in the luminance distribution of the present example in FIG. 16, the reduction in the luminance distribution between the light emitting elements could be suppressed by the single phosphor layer 103 entirely covering the bridge portions 105 and the light emitting elements 102. The intensity obtained between the light emitting elements 102 can be half the maximum peak intensity or so. The single phosphor layer 103 had a domed shape covering the entire elements 102, so that the luminance distribution of the semiconductor light emitting device shown in FIG. 16 was flat at the non-light emission area D outside the emission area. Furthermore, it can be confirmed that the difference between the light emission area and non-light emission area in the luminance distribution line was sharper than the case of comparative example 1.

<Fourth Exemplary Embodiment>

A description will now be given of a semiconductor light emitting device 200 of a fourth exemplary embodiment with reference to the drawings.

The semiconductor light emitting device 200 of the present exemplary embodiment can include a mounting substrate 210, a plurality of semiconductor light emitting elements 220, bridge portions 230, a wavelength conversion layer 240, and the like, as shown in FIGS. 19A-C.

The mounting substrate 210 can be a ceramic substrate or a silicon substrate having patterned wiring, for example.

The semiconductor light emitting element 220 can be a light emitting element with a rectangular shape in a plane view. The semiconductor light emitting element 220 has one end side 220a and another end side 220b opposite thereto. The respective elements 220 can be disposed at regular intervals on the substrate 210 so that the one end sides 220a and the other end sides 220b are positioned on a line L1 and a line L2, respectively, with the lines L1 and L2 being parallel to each other (see FIG. 19). The bridge portions 230 can be formed in the respective intervals between the adjacent semiconductor light emitting elements 220.

Figure 20:
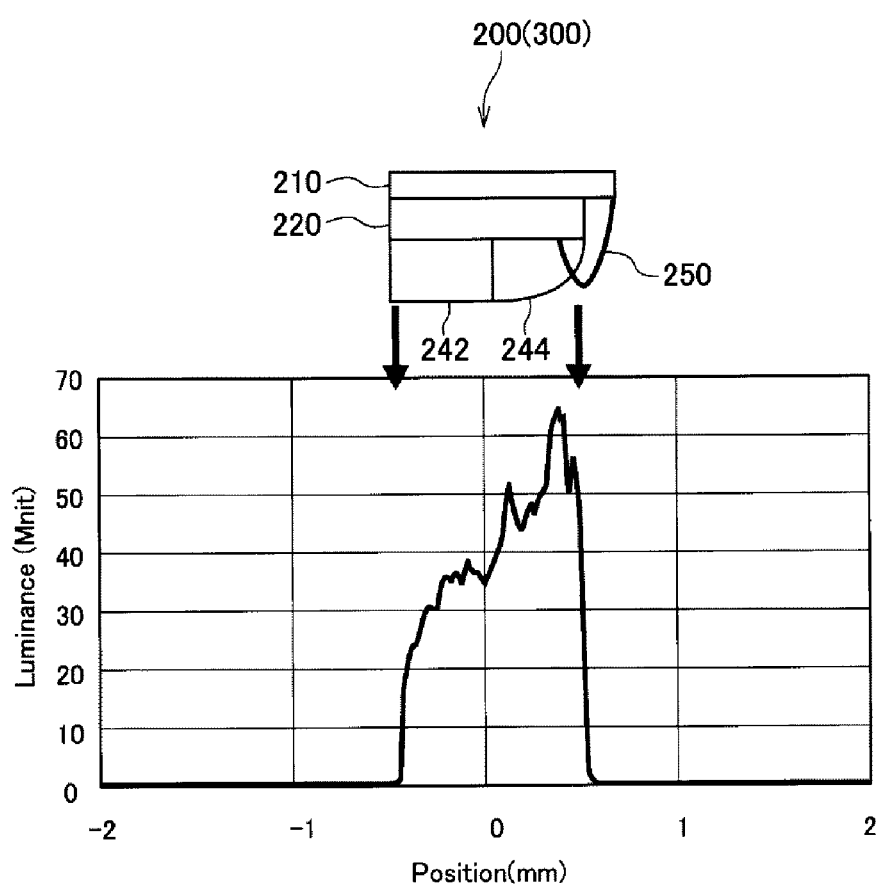
FIG. 20 is a graph showing luminance distribution along the longitudinal direction of the semiconductor light emitting device 200 of the fourth or fifth exemplary embodiment (perpendicular to the arranged line direction)

As shown in FIGS. 19A-C, the wavelength conversion layer 240 can include a thickness-decreased portion 244 and a thickness-uniform portion 242. The thickness-decreased portion 244 can be formed as a quarter barrel shape in part so that it ranges from the center line L3 of the plurality of semiconductor light emitting elements 220 (or near the center line L3) to the one end sides 220a of the elements 220 (line L1), with the thickness being decreased from the center line L3 (or near the center line L3) toward the one end sides 220a (line L1). The thickness-uniform portion 242 can be formed as a rectangle parallelepiped shape with a constant thickness so that it ranges from the center line L3 (or near the center line L3) to the other end sides 220b (line L2) opposite to the one end sides 220a (line L1). The wavelength conversion layer 240 can be continuously formed over the plurality of semiconductor light emitting elements 220 with the support of the bridge portions 230. The thickness of both the thickness decreased portion 244 and the thickness-uniform portion 242 can be measured along the light emitting direction of the light emitting device 200. More specifically, the thickness of the wavelength conversion layer 240 as it relates to both the thickness decreased portion 244 and the thickness-uniform portion 242 can be measured in a direction that is substantially parallel with an optical axis of the light emitting device 200, wherein the light emitting direction is also substantially parallel with the optical axis of the light emitting device 200, FIG. 20 is a graph showing the luminance distribution along the longitudinal direction of the semiconductor light emitting device 200 of the fourth exemplary embodiment. In a conventional configuration of a semiconductor light emitting device where the wavelength conversion layer has a constant thickness entirely, the luminance distribution along the longitudinal direction shows gradual decrease in luminance toward the peripheral of the chip with the chip center as a maximum luminance. On the contrary, the semiconductor light emitting device 200 of the present exemplary embodiment can provide the luminance distribution along its longitudinal cross section having a gradation with an abrupt rise from the other end side of the element corresponding to the thickness-decreased portion (hereinafter, referred to as a barrel inclined portion in some cases) and which gradually decreases over the thickness-uniform portion toward the one end side, as shown in FIG. 20. Namely, the semiconductor light emitting device 200 of the present exemplary embodiment can be one suitable for a vehicle light, with an abruptly rising luminance distribution at one end thereof.

Figure 31:
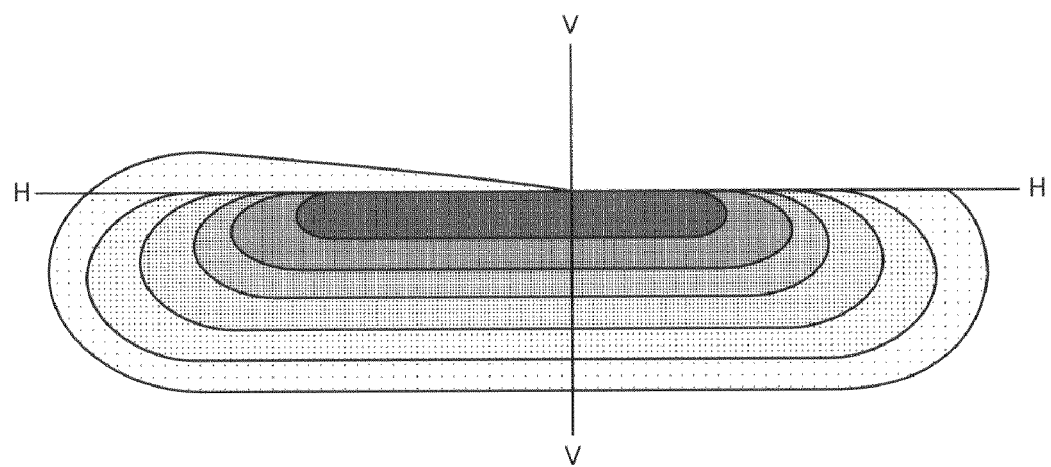
FIG. 31 is a diagram illustrating an exemplary image of a light distribution pattern of a vehicle light utilizing any of the semiconductor light emitting devices 200 and 300 of the fourth and fifth exemplary embodiments.

FIG. 31 illustrates an exemplary image of a light distribution pattern of a vehicle light utilizing the semiconductor light emitting device 200 of the present exemplary embodiment. In FIG. 31, the center horizontal line represents the light/dark border where the upper dark area corresponds to an opposing vehicle side and the lower light area corresponds to a road surface side or a sidewalk side. In general, the maximum luminance can be located just below the light/dark border. Furthermore, a gradation where the luminance decreases toward the lower area may be the best light distribution in view of the far-distance visibility and road surface luminance. In a conventional configuration of a semiconductor light emitting device where the wavelength conversion layer has a constant thickness entirely, as shown in FIG. 4 the maximum luminance is around the chip center. In this case, in order to conform to the above best luminance distribution condition, half the available light may be cut to obtain the maximum luminance at the light/dark border, thereby wasting the usable light.

On the contrary, the semiconductor light emitting device 200 of the present exemplary embodiment can conform to the best luminance distribution by disposing the abrupt rising of the luminance at the end of the element, as shown in FIG. 20, just below the light/dark border where the maximum luminance should be placed as well as the gradation of the device where the luminance gradually decreases can be conformed to the best luminance distribution. Namely, the luminance distribution available by the semiconductor light emitting device 200 can be effectively utilized as a whole.

Next, a description will be made with respect to a method for manufacturing the semiconductor light emitting device of the present exemplary embodiment with reference to FIG. 21A to 21D.

A ceramic substrate 210 can be formed with an electrode wiring pattern on its surface in advance. A plurality of (four in the present exemplary embodiment) semiconductor light emitting elements 220 can be disposed and bonded on the substrate 210 with a common bonding material (not shown). Then, not-shown electrodes on the top surfaces of the light emitting elements 220 can be bonded to not-shown electrodes of the ceramic substrate 210 by gold wire 250 (see FIG. 21A).

The semiconductor light emitting element 220 can have a structure in which a semiconductor light emitting layer 222 having a thickness of several microns is formed on a conductive opaque substrate 224 (for example, a silicon or germanium substrate). A reflective layer (not shown) such as silver or aluminum can be disposed between the light emitting layer 222 and the opaque substrate 224 so that almost all the light emitted from the light emitting layer 222 can be projected in the front direction of the element 220. It should be noted that the semiconductor light emitting element 220 employed in the present exemplary embodiment can provide certain benefits because of the high light emitting density and high luminance easily achieved when compared with the semiconductor light emitting element having a transparent sapphire substrate on which the semiconductor light emitting layers are deposited.

Figure 21A:
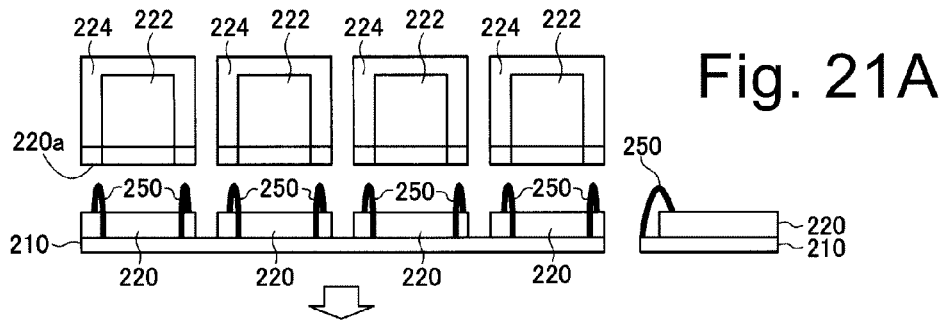
FIGS. 21A, 21B, 21C, and 21D each include a top plan view, a front view, and a side view of the semiconductor light emitting device of the fourth exemplary embodiment in respective time increments of the producing method.
Figure 21B:
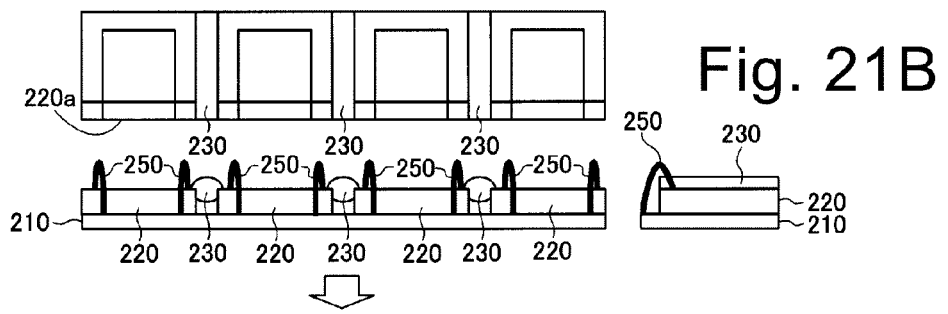
Figure 21C:
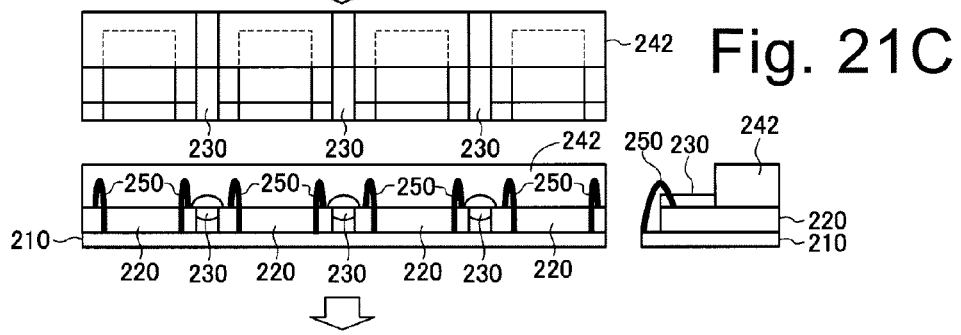
Figure 21D:
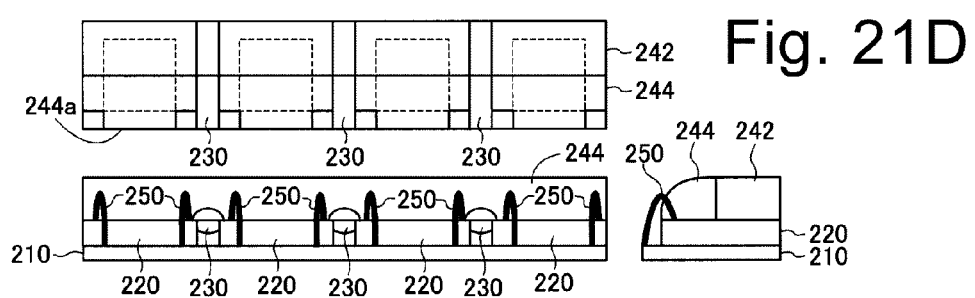

The semiconductor light emitting layer 222 can be formed to have a smaller size than the conductor opaque substrate 224 in a plan view (see FIG. 21A). This is because, when a wafer including a plurality of elements 220 is diced or scribed to separate the individual light emitting elements 220 therefrom, the cleavage of the semiconductor light emitting layer 222 and the associated damage of the interface are prevented. Accordingly, a non-emission portion with a constant width "a" can exist on the top surface of the substrate 1022 and around the outer peripheral area of the light emitting layer as shown in FIG. 9.

Then, the bridge portions 230 can be formed between the semiconductor light emitting elements 220 so that the bridge portion 230 linearly fills the interval therebetween (and part of the non-illumination areas), thereby connecting the end sides 220a of the light emitting elements 220 continuously. In this case, the material for the bridge portion 230 can be selected from materials having heat resistance and stress resistance, such as thermosetting resins, RTV rubbers, and the like. Examples of the thermosetting resins used herein include but are not limited to silicone resins, epoxy resins, phenol resins, polyimide resins, melamine resins, and the like. The resin material can be mixed with a filler such as titanium oxide, alumina, or the like to impart a light reflecting property to the bridge portion 105, thereby enhancing the light utilization efficiency. When the bridge portions 230 are formed from a thermosetting resin, the bridge portions 105 can be formed by a dispenser coating process, a screen printing process, a stencil printing process, or similar process. When the bridge portions 230 are formed by a dispenser coating process, the wire bonding process can be carried out before the formation of the bridge portions 230. When they are formed by a screen or stencil printing process, a mask alignment process for printing is taken into consideration and the wire bonding process can be carried out after the formation of the bridge portions 230. The positional relationship between the bridge portions 230 and the wire bonding portion 250 is not limited to the present exemplary embodiment. Depending on the position of the wire bonding portion 250, the bridge portion formation process and the wire bonding process can be carried out in any arbitrary order.

The width of the bridge portion 230 can be adjusted within a range of {(the interval between the adjacent light emitting elements 220)+(twice the width of the non-emission portion of the element 220)}. The width of the bridge portion 230 greater than the above range may not be preferable in certain cases because the bridge portion 230 may cover part of the light emitting layer 222. If it would be expected that the resin material run out, the resin material can be prepared to have a higher viscosity or thixotropy for maintaining its shape for a long period of time after coating or printing (see FIG. 21B).

Next, a silicone resin and a certain phosphor are mixed and molded by a mold to form a thickness-uniform portion 242 having a rectangle parallelepiped shape in advance. The prepared thickness-uniform portion 242 can be mounted on the half area (where the gold wiring 250 is not provided) of the top surface of the semiconductor light emitting element 220 by a mounting machine while applying a not-shown load (see FIG. 21C). In this instance, the bridge portions 230 may serve as an adhesive to fix the thickness-uniform portion 242 (see FIG. 21C). Then, while this state is maintained, the entire device can be heated to cure the resin. In this way, the thickness-uniform portion 242 and the bridge portions 230 are securely fixed while the shapes thereof can be maintained.

Next, for example, a mixed coating liquid including a silicone resin and a phosphor can be coated on the semiconductor light emitting element at the gold wiring 250 area in an appropriate amount. In this case, an appropriate surface tension of the liquid can form a thickness-decreased portion 244 with a quarter barrel shape and an equal thickness to that of the thickness-uniform portion 242 at the area in contact with each other. On the other hand, the end portion 244a of the thickness-decreased portion 244 may be prevented from running out to the substrate surface 210, by the surface tension appropriately controlled by the coating amount of resin. Accordingly, it is possible to cure the resin while its surface shape can be maintained. In the above configuration, as the wavelength conversion layer can be continuous over the light emitting elements, the surface concavity and convexity can be leveled during coating, meaning that the wavelength conversion layer can be shaped into a quarter barrel depending on the coating amount and the resulting layer can have a uniform phosphor concentration above the respective light emitting elements 220, so that the light color unevenness and luminance unevenness can be improved (see FIG. 21D). Note that in the conventional art the wavelength conversion layer is provided to each of the light emitting elements by coating, printing or other method. Accordingly, the hue may vary depending on the coated amount difference.

As a result, the semiconductor light emitting device 200 can be manufactured.

In the present exemplary embodiment, the wavelength conversion layer 240 can have the thickness-uniform portion 242 and the thickness-reduced portion 244, so that the cross-section thereof is asymmetric. Accordingly, it is possible to provide the semiconductor light emitting device 200 having a novel luminance distribution (see FIG. 20) which is absolutely different from the conventional light emitting device, for forming an appropriate light distribution pattern for a vehicle headlight.

<Fifth Exemplary Embodiment>

A description will now be given of a semiconductor light emitting device 300 of a fifth exemplary embodiment with reference to the drawings.

The semiconductor light emitting device 300 of the present exemplary embodiment can include a mounting substrate 310, a plurality of semiconductor light emitting elements 320, a light reflecting coating portion 330, a wavelength conversion layer 340, and the like, as shown in FIGS. 22A-C.

The mounting substrate 310 can be a ceramic substrate or a silicon substrate having patterned wiring, for example. The semiconductor light emitting element 320 can be a light emitting element with a rectangular shape in a plane view. The semiconductor light emitting element 320 has one end side 320a and another end side 320b opposite thereto. The respective elements 320 can be disposed at regular intervals on the substrate 310 so that the one end sides 320a and the other end sides 320b are positioned on a line L1 and a line L2, respectively, with the lines L1 and L2 being parallel to each other (see FIGS. 22A-C).

As shown in FIGS. 22A-C, the wavelength conversion layer 340 can include a thickness-decreased portion 344 having a quarter barrel shape and a thickness-uniform portion 342 having a rectangular parallelepiped shape with the center line L3 interposed therebetween. Specifically, the barrel-shaped thickness-decreased portion 344 can be formed so that it ranges from the center line L3 of the plurality of semiconductor light emitting elements 320 (or near the center line L3) to the one end sides 320a of the elements 320 (line L1), with the thickness decreasing from the center line L3 (or near the center line L3) toward the one end sides 220a (line L1). The thickness-uniform portion 342 can be formed as a rectangle parallelepiped shape with a constant thickness so that it ranges from the center line L3 (or near the center line L3) to the other end sides 320b (line L2) opposite to the one end sides 220a (line L1).

In this configuration, the semiconductor light emitting device 300 can provide favorable luminance distribution along the longitudinal direction as described with reference to FIG. 20. Note that the luminance distribution obtained by the present semiconductor light emitting device 300 is the same as in the previous exemplary embodiment, the description thereof is omitted here.

Next, a description will be made to with regard to an exemplary method for manufacturing the semiconductor light emitting device of the present exemplary embodiment with reference to FIGS. 23A to 23C.

The semiconductor light emitting element 320 used in the present exemplary embodiment can be formed on an insulative transparent substrate 310, for example, a sapphire substrate, on which a semiconductor light emitting layer 322 having a thickness of several microns is formed. A reflective layer such as silver or aluminum can be deposited on the light emitting layer 322 with a flip chip structure where electrodes for p-layers and n-layers are bonded to the mounting substrate 310 with gold bump.

Figures 23A, 23B, 23C:
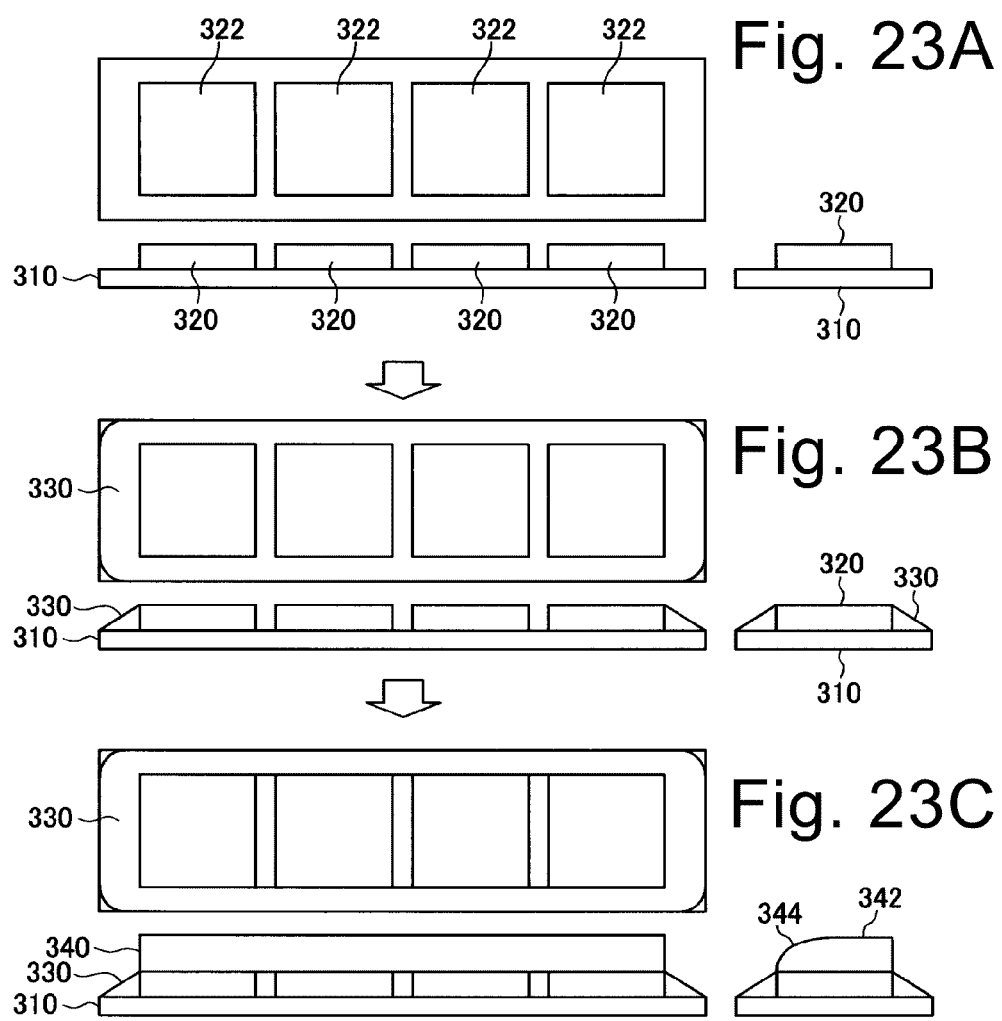
FIGS. 23A, 23B, and 23C each include a top plan view, a front view, and a side view of the semiconductor light emitting device of the fifth exemplary embodiment in respective time increments of the producing method.

A reflective coating portion 330 can be formed on end portions surrounding the semiconductor light emitting elements 320 (see FIG. 23B). The shape controlling of the coating portion 330 can be performed as follows. Namely, the outer dimension of the mounting substrate 310 can be appropriately selected from a difference to the actual dimension of the semiconductor light emitting element 320 to set the constant outer periphery. In this way, a coating portion 330 can be formed to have a triangle cross section by the surface tension of the coating liquid between the end portion of the mounting substrate 310 and the side face of the light emitting element 320 (see FIG. 23B). In this case, the coating portion 330 should not cover the top surfaces of the elements 320, but should only cover the side surfaces of the elements 320. This configuration can prevent part of the light emitted from the light emitting layer 322 of the semiconductor light emitting elements 320 in the lateral direction from being projected sideward and passing through the transparent substrate 310.

In particular, when the semiconductor light emitting device 300 is used in a vehicle headlight, it is important to direct the light in a certain direction because in general luminance on the optical axis can determine the lateral extent of the light distribution. In order to comply with this requirement, a reflecting filler may be mixed into the coating portion 330, including titanium oxide, aluminum oxide, barium sulfate, and the like selected depending on the required specification. Furthermore, in order to allow the coating to flow through the spaces between the semiconductor light emitting elements due to its surface tension, the coating containing the reflecting filler can be appropriately designed by the material viscosity and thixotropic property. By doing so, the coating can be maintained in shape to surround the elements 320 as well as fill the spaces between the elements 320.

Next, the wavelength conversion layer 340 having a thickness-uniform portion and a thickness-decreased portion (quarter barrel portion) can be molded in advance by a mold using a mixture of a silicone resin and a phosphor to form the layer 340 having a desired dimension, and the layer 340 can be mounted on the upper surface of the semiconductor light emitting element 320 by a mounting machine while applying a not-shown load (see FIG. 23C). The wavelength conversion layer 340 may be secured on the semiconductor light emitting element 320 by an adhesive layer interposed therebetween.

In this way, the semiconductor light emitting device 300 can be manufactured.

In the present exemplary embodiment, the wavelength conversion layer 340 can have the thickness-uniform portion 342 and the thickness-reduced portion 344, so that the cross-section thereof is asymmetric. Accordingly, it is possible to provide the semiconductor light emitting device 300 having a novel luminance distribution (see FIG. 20) which is absolutely different from the conventional light emitting device, for forming an appropriate light distribution pattern for a vehicle headlight.

<Sixth Exemplary Embodiment>

A description will now be given of an example where the semiconductor light emitting device 200 of the fourth exemplary embodiment including the thickness-decreased portion 244 is utilized for a vehicle light 400. It should be noted that the vehicle light 400 can be constituted by employing any of the semiconductor light emitting devices of the first, second, third and fifth exemplary embodiments because they each include the portion corresponding to the thickness-decreased portion 244, thereby obtaining the advantageous effects of the presently disclosed subject matter.

Figure 24B:
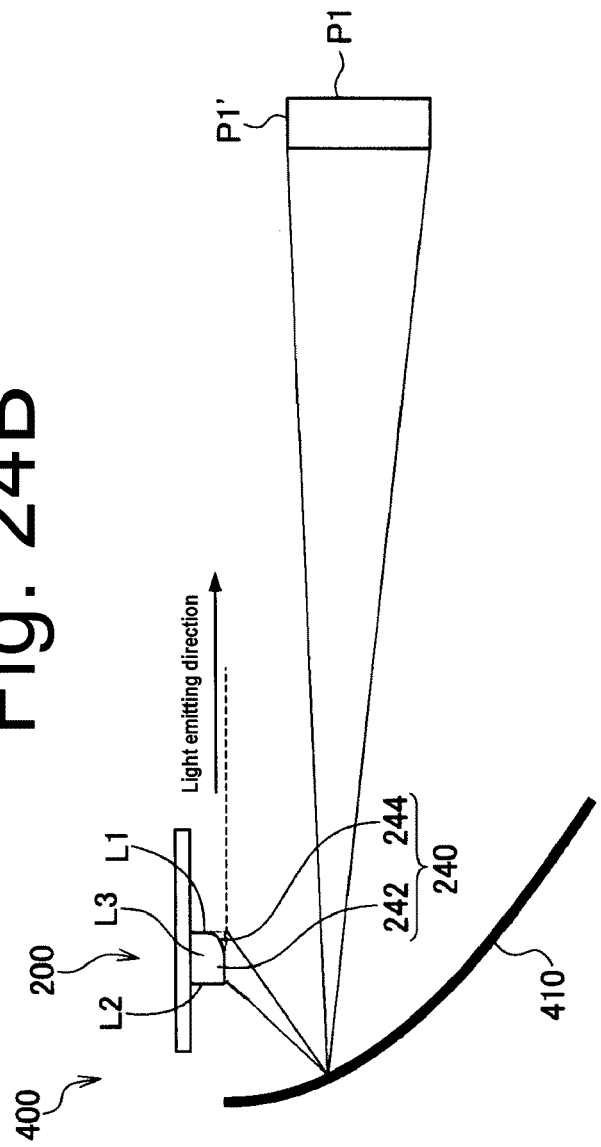
FIG. 24B is a longitudinal cross sectional view of the same.
Figure 24A:
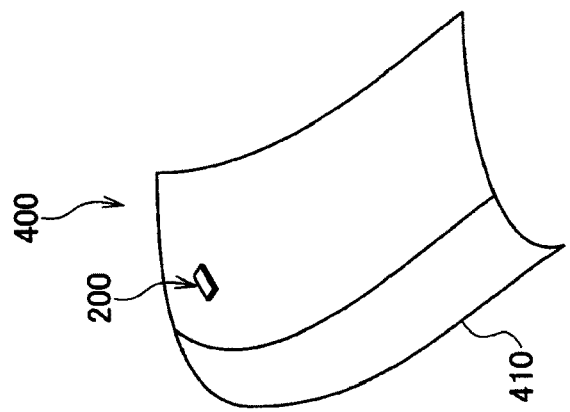
FIG. 24A is a perspective view of a vehicle light 400 of a sixth exemplary embodiment made in accordance with principles of the presently disclosed subject matter.

The vehicle light 400 of the present exemplary embodiment can include the semiconductor light emitting device 200 and a reflecting surface 410 (being equivalent to the projection optical system of the presently disclosed subject matter), as shown in FIGS. 24A and 24B.

The semiconductor light emitting device 200 can have the configuration as shown in FIG. 19. The semiconductor light emitting device 200 can be disposed such that the thickness-decreased portion 244 is disposed at a farther side from the reflecting surface 410 and the light emitting direction of the semiconductor light emitting device 200, or the light emitting surface of the semiconductor light emitting device 200 is directed downward (see FIG. 24B).

The reflecting surface 410 can be a revolved parabolic reflector having a focus at or near the semiconductor light emitting device 200. The reflector can have a plurality of small reflecting areas, and be a so-called multi-reflector. The reflecting surface 410 can be disposed in the light emitting direction of the semiconductor light emitting device 200 (in the present exemplary embodiment, below the semiconductor light emitting device 200, see FIG. 24B).

The reflecting surface 410 can project a plurality of light source images P1 (being the image of the semiconductor light emitting device 200) each including an image portion P1' corresponding the thickness-decreased portion 244 at its upper area (see FIGS. 24B and 25). In this instance, suppose that there is a vertical screen arranged at a predetermined position (a virtual vertical plane at a distance from the vehicle light). In this case, the vehicle light 400 can arrange the image portions P1' corresponding to the thickness-decreased portion 244 with a higher density in the horizontal and oblique directions (by 15° with respect to the horizontal direction, for example), as shown in FIG. 25, thereby forming a horizontal cutoff line CL1 and an oblique cutoff line CL2.

In the vehicle light 400 of the present exemplary embodiment, the semiconductor light emitting device 200 can be arranged in position with respect to the reflecting surface 410 in accordance with the above-mentioned positional relationship (see FIGS. 24A and 24B). The thus arranged reflection surface 410 can project the plurality of light source images P1 (the image of the semiconductor light emitting device 200) each having the image portion P1' corresponding to the thickness-decreased portion 244 at the upper area thereof (FIGS. 24B and 25). Specifically, the image portions P1' corresponding to the thickness-decreased portion 244 can be arranged with a higher density in the horizontal and oblique directions (by 15° with respect to the horizontal direction, for example), thereby forming the horizontal cutoff line CL1 and the oblique cutoff line CL2, as shown in FIG. 25. As shown in FIGS. 20 & 25, the image portions P1' corresponding to the thickness-decreased portion 244 can have a higher luminance than that of the conventional light emitting device. Accordingly, the vehicle light 400 of the present exemplary embodiment can form a favorable light distribution pattern P for a low beam having a clearer cutoff line (including the horizontal cutoff line CL1 and the oblique cutoff line CL2) than that of the conventional light emitting device (see FIG. 25).

<Seventh Exemplary Embodiment>

A description will now be given of an example where the semiconductor light emitting device 200 of the fourth exemplary embodiment including the thickness-decreased portion 244 is utilized for a vehicle light 500. It should be noted that the vehicle light 500 can employ any of the semiconductor light emitting devices of the first, second, third and fifth exemplary embodiments because they each include the portion corresponding to the thickness-decreased portion 244.

The vehicle light 500 of the present exemplary embodiment can include the semiconductor light emitting device 200 and a reflecting surface 510 (being equivalent to the projection optical system of the presently disclosed subject matter), as shown in FIGS. 26A and 26B.

The semiconductor light emitting device 200 can be disposed such that the thickness-decreased portion 244 is disposed at a side closer to the reflecting surface 510 and the light emitting direction of the semiconductor light emitting device 200, or the light emitting surface of the semiconductor light emitting device 200 is directed upward (see FIG. 26B).

The reflecting surface 510 can be a revolved parabolic reflector having a focus at or near the semiconductor light emitting device 200. The reflector can have a plurality of small reflecting areas, and be a so-called multi-reflector. The reflecting surface 510 can be disposed in the light emitting direction of the semiconductor light emitting device 200 (in the present exemplary embodiment, above the semiconductor light emitting device 200, see FIG. 26B).

The reflecting surface 510 can project a plurality of light source images P1 (being the image of the semiconductor light emitting device 200) each including an image portion P1' corresponding the thickness-decreased portion 244 at its upper area (see FIGS. 26B and 25). In this instance, suppose that there is a vertical screen arranged at a predetermined position (a virtual vertical plane at a distance from the vehicle light). In this case, the vehicle light 500 can arrange the image portions P1' corresponding to the thickness-decreased portion 244 with a higher density in the horizontal and oblique directions (by 15° with respect to the horizontal direction, for example), as shown in FIG. 25, thereby forming a horizontal cutoff line CL1 and an oblique cutoff line CL2. Accordingly, as in the previous exemplary embodiment, the vehicle light 500 of the present exemplary embodiment can form a favorable light distribution pattern P for a low beam having a clearer cutoff line (including the horizontal cutoff line CL1 and the oblique cutoff line CL2) than that of the conventional light emitting device (see FIG. 25).

<Eighth Exemplary Embodiment>

A description will now be given of an example where the semiconductor light emitting device 200 of the fourth exemplary embodiment including the thickness-decreased portion 244 is utilized for a vehicle light 600. It should be noted that the vehicle light 600 can employ any of the semiconductor light emitting devices of the first, second, third and fifth exemplary embodiments because they each include the portion corresponding to the thickness-decreased portion 244.

Figure 27B:
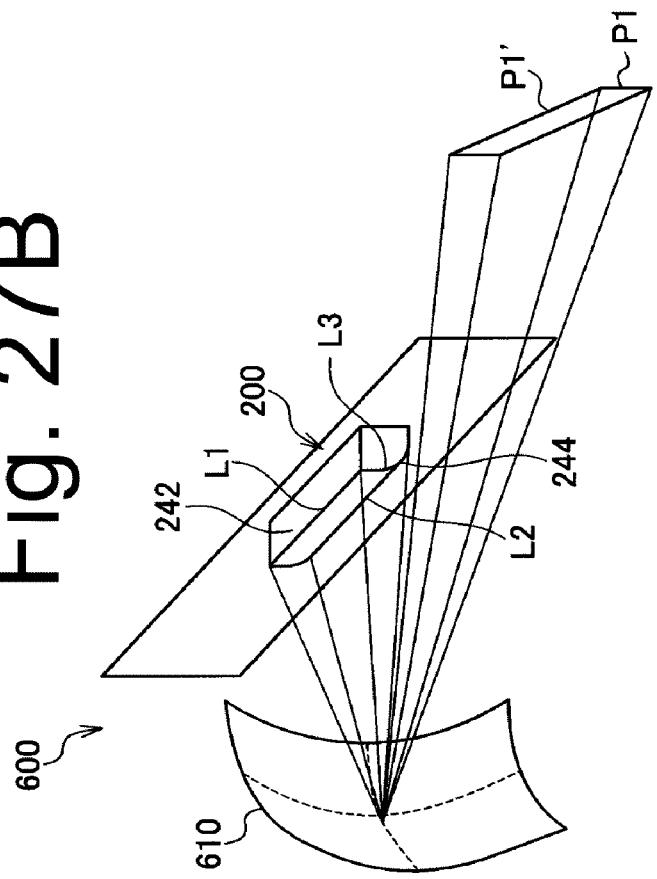
FIG. 27B is another perspective view of the same.
Figure 27A:
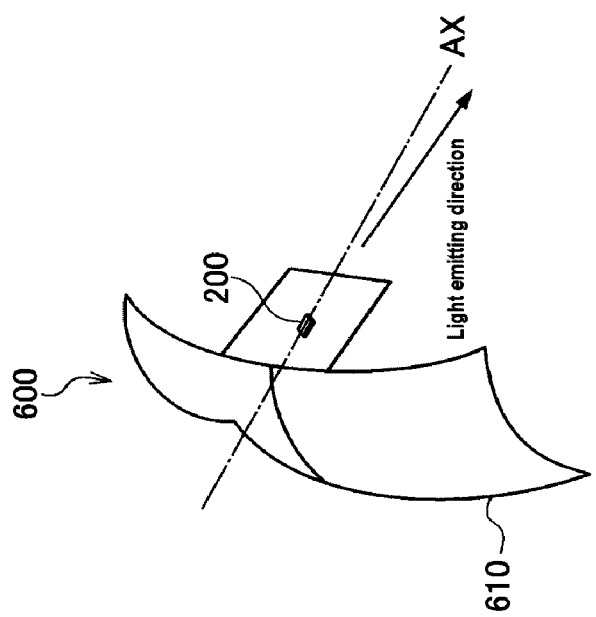
FIG. 27A is a perspective view of a vehicle light 600 of an eighth exemplary embodiment made in accordance with principles of the presently disclosed subject matter.

The vehicle light 600 of the present exemplary embodiment can include the semiconductor light emitting device 200 and a reflecting surface 610 (being equivalent to the projection optical system of the presently disclosed subject matter), as shown in FIGS. 27A and 27B.

The semiconductor light emitting device 200 can be disposed such that the thickness-decreased portion 244 is disposed on the lower side and the light emitting direction of the semiconductor light emitting device 200, or the light emitting surface of the semiconductor light emitting device 200 is set horizontally (laterally) (see FIG. 27B).

The reflecting surface 610 can be a revolved parabolic reflector having a focus at or near the semiconductor light emitting device 200. The reflector can have a plurality of small reflecting areas, and be a so-called multi-reflector. The reflecting surface 610 can be disposed in the light emitting direction of the semiconductor light emitting device 200 (in the present exemplary embodiment, beside the semiconductor light emitting device 200, see FIG. 27B).

The reflecting surface 610 can project a plurality of light source images P1 (being the image of the semiconductor light emitting device 200) each including an image portion P1' corresponding the thickness-decreased portion 244 at its upper area (see FIGS. 27B and 25). In this instance, suppose that there is a vertical screen arranged at a predetermined position (a virtual vertical plane at a distance from the vehicle light). In this case, the vehicle light 600 can arrange the image portions P1' corresponding to the thickness-decreased portion 244 with a higher density in the horizontal and oblique directions (by 15° with respect to the horizontal direction, for example), as shown in FIG. 25, thereby forming a horizontal cutoff line CL1 and an oblique cutoff line CL2. Accordingly, as in the previous exemplary embodiments, the vehicle light 600 of the present exemplary embodiment can form a favorable light distribution pattern P for a low beam having a clearer cutoff line (including the horizontal cutoff line CL1 and the oblique cutoff line CL2) than that of the conventional light emitting device (see FIG. 25).

<Ninth Exemplary Embodiment>

A description will now be given of an example where the semiconductor light emitting device 200 of the fourth exemplary embodiment including the thickness-decreased portion 244 is utilized for a vehicle light 700. It should be noted that the vehicle light 700 can employ any of the semiconductor light emitting devices of the first, second, third and fifth exemplary embodiments because they each include the portion corresponding to the thickness-decreased portion 244.

The vehicle light 700 of the present exemplary embodiment can include the semiconductor light emitting device 200, a reflecting surface 710, a shade 720, and a projection lens 730. The combination of the reflecting surface 710, the shade 720, and the projection lens 730 can constitute the projection optical system of the presently disclosed subject matter), as shown in FIGS. 28 and 29.

Figure 28:
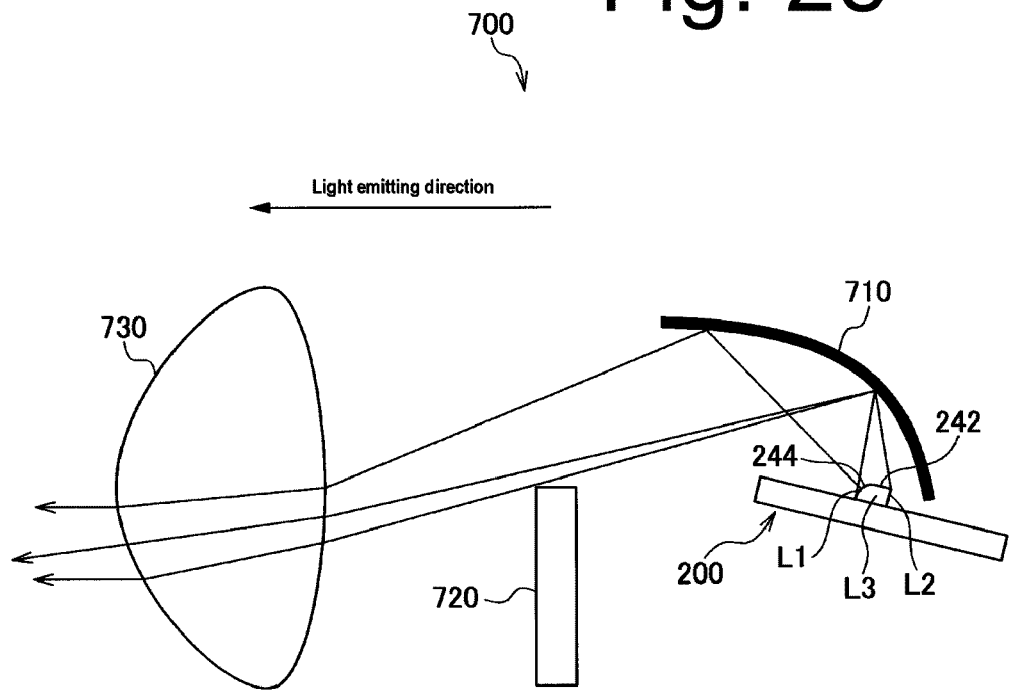
FIG. 28 is a longitudinal cross sectional view of a vehicle light 700 of a ninth exemplary embodiment made in accordance with principles of the presently disclosed subject matter.
Figure 29:
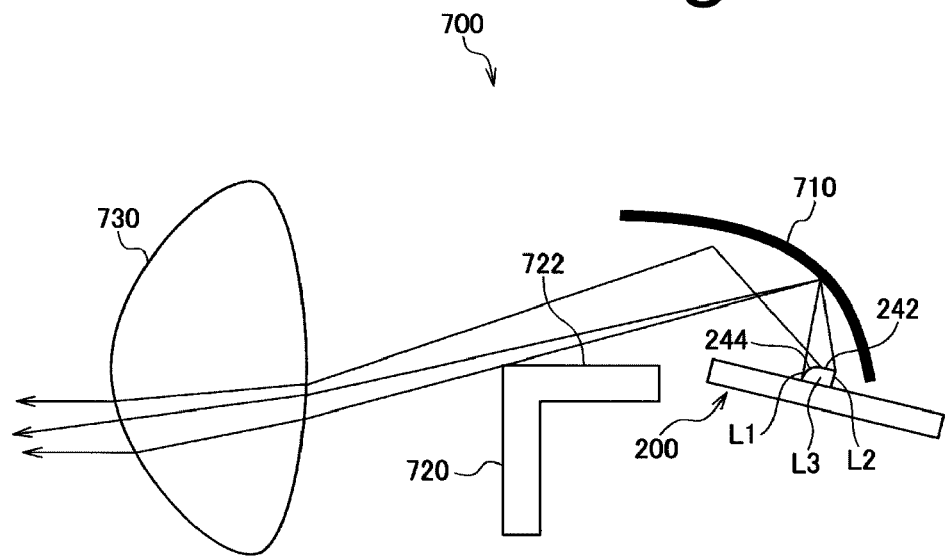
FIG. 29 is a longitudinal cross sectional view of a modification of the vehicle light 700 of the ninth exemplary embodiment.

The semiconductor light emitting device 200 can be disposed such that the thickness-decreased portion 244 is disposed at a side farther from the reflecting surface 710 (or forward in the light emitting direction) and the light emitting direction of the semiconductor light emitting device 200, or the light emitting surface of the semiconductor light emitting device 200 is set directed upward (see FIGS. 28 and 29).

The reflecting surface 710 can be a revolved elliptic reflector having a first focus at or near the semiconductor light emitting device 200 and a second focus at or near the upper edge of the shade 720. The reflecting surface 710 can be disposed in the light emitting direction of the semiconductor light emitting device 200 (in the present exemplary embodiment, above the semiconductor light emitting device 200, see FIG. 28). Furthermore, in the present exemplary embodiment, in order to increase the available light amount, or for the reflecting surface 710 to effectively capture the luminous flux from the semiconductor light emitting device 200, the semiconductor light emitting device 200 can be disposed so that the posture is set obliquely rearward (or the upward light emitting direction is slightly slanted rearward). The reflecting surface 710 can be configured to cover the range from near the substrate to the position where the extending reflecting surface 710 does not hinder the light reflected by the reflecting surface 710 toward the projection lens 730. Accordingly, the reflecting surface 510 can reflect (direct) a plurality of light source images P1 each including an image portion P1' corresponding the thickness-decreased portion 244 at its upper area to the projection lens 730 (see FIGS. 28 and 29).

The shade 720 can shield part of the reflected light from the reflecting surface 710 to form a cutoff pattern. The shade 720 can be disposed between the projection lens 730 and the semiconductor light emitting device 200 while the upper edge thereof coincides with the focus of the projection lens. It should be noted that the shade 720 may be a shade with a horizontal reflector 722 as shown in FIG. 29, thereby enhancing the light utilization efficiency. Further, the cutoff line shape formed by the shade 720 may be any shape including a horizontal line, oblique line, and the like.

In the vehicle light 700 of the present exemplary embodiment, the semiconductor light emitting device 200 can be arranged in position with respect to the reflecting surface 710 in accordance with the above-mentioned positional relationship (see FIGS. 28 and 29). The plurality of light source images P1 each having the image portion P1' corresponding to the thickness-decreased portion 244 at the upper area thereof can be shielded in part by the shade 720 and then projected via the projection lens 730. Specifically, the image portions P1' corresponding to the thickness-decreased portion 244 can be arranged with a higher density in the horizontal and oblique directions, thereby forming the horizontal cutoff line CL1 and the oblique cutoff line CL2, as shown in FIG. 25. As shown in FIGS. 20 & 25, the image portions P1' corresponding to the thickness-decreased portion 244 can have a higher luminance than that of the conventional light emitting device. Accordingly, the vehicle light 700 of the present exemplary embodiment can form a favorable light distribution pattern for a low beam having a clearer cutoff line (including the horizontal cutoff line CL1 and the oblique cutoff line CL2) than that of the conventional light emitting device (see FIG. 25).

<Tenth Exemplary Embodiment>

A description will now be given of an example where the semiconductor light emitting device 200 of the fourth exemplary embodiment including the thickness-decreased portion 244 is utilized for a vehicle light 800. It should be noted that the vehicle light 800 can employ any of the semiconductor light emitting devices of the first, second, third and fifth exemplary embodiments because they each include the portion corresponding to the thickness-decreased portion 244.

The vehicle light 800 of the present exemplary embodiment can include the semiconductor light emitting device 200, a shade 810, and a projection lens 820. The combination of the shade 810 and the projection lens 820 can constitute the projection optical system of the presently disclosed subject matter), as shown in FIG. 30.

Figure 30:
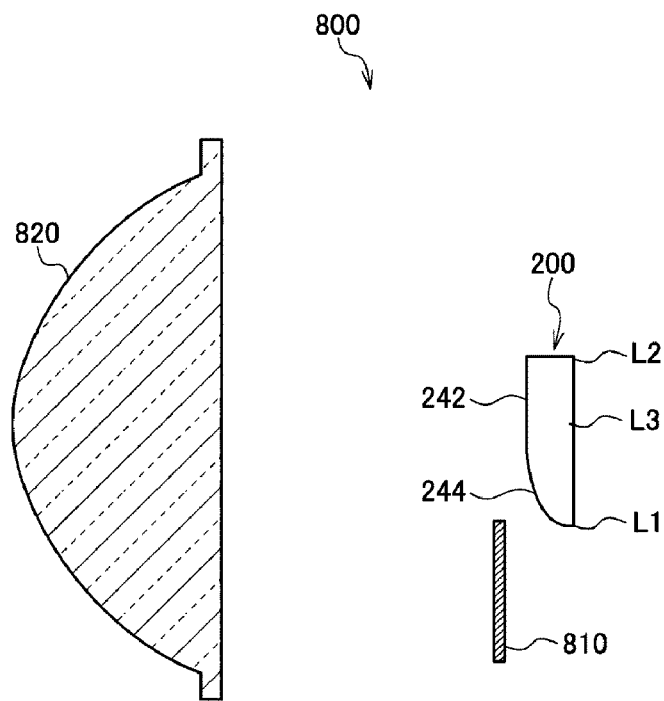
FIG. 30 is a longitudinal cross sectional view of a vehicle light 800 of a tenth exemplary embodiment made in accordance with principles of the presently disclosed subject matter.

The semiconductor light emitting device 200 can be disposed such that the thickness-decreased portion 244 is disposed at a side closer to the projection lens 820 and on a lower portion (see FIG. 30).

The shade 810 can shield part of the light emitted from the semiconductor light emitting device 200 to form a cutoff pattern. The shade 810 can be disposed between the projection lens 820 and the semiconductor light emitting device 200 while the upper edge thereof coincides with the focus of the projection lens.

In the vehicle light 800 of the present exemplary embodiment, the semiconductor light emitting device 200 can be arranged in position with respect to the projection lens 820 in accordance with the above-mentioned positional relationship. The light source images P1 each having the image portion P1' corresponding to the thickness-decreased portion 244 at the upper area thereof can be shielded in part by the shade 810 and then projected via the projection lens 820.

Specifically, the image portions P1' corresponding to the thickness-decreased portion 244 can be arranged with a higher density in the horizontal and oblique directions, thereby forming the horizontal cutoff line CL1 and the oblique cutoff line CL2, as shown in FIG. 25. As shown in FIGS. 20 & 25, the image portions P1' corresponding to the thickness-decreased portion 244 can have a higher luminance than that of the conventional light emitting device. Accordingly, the vehicle light 800 of the present exemplary embodiment can form a favorable light distribution pattern for a low beam having a clearer cutoff line (including the horizontal cutoff line CL1 and the oblique cutoff line CL2) than that of the conventional light emitting device (see FIG. 25). It should be noted that the shade 810 can be removed because the semiconductor light emitting device 200 can form a clear cutoff line to a certain extent whereas the shade 810 can form the clearer cutoff line as described above.

In the above exemplary embodiments, a plurality of semiconductor light emitting elements 102 (220, 320) are described to be arranged in line at predetermined intervals, but the presently disclosed subject matter is not limited to this. A single semiconductor light emitting element 102 (220, 320) can be employed for constituting the semiconductor light emitting device as long as the light amount from such a single semiconductor light emitting element 102 is sufficient for a vehicle light or other illumination device.

The sixth to tenth exemplary embodiments each can employ any of the semiconductor light emitting devices of the first to fifth exemplary embodiments for constituting a vehicle light. However, the presently disclosed subject matter is not limited to this. For example, the semiconductor light emitting devices of the first to fifth exemplary embodiments can be employed in general lighting fixtures, street lamps, and various other light emitting apparatuses.

In the sixth to tenth exemplary embodiments, the image portions P1' corresponding to the thickness-decreased portion 244 can be arranged with a higher density in the horizontal and oblique directions, but they may be arranged in one of the horizontal and oblique directions.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A vehicle light, comprising:
a semiconductor light emitting device including a semiconductor light emitting element having a light emitting surface and a wavelength conversion layer configured to cover the light emitting surface of the semiconductor light emitting element, the wavelength conversion layer having a thickness-decreased portion and a thickness-uniform portion, the thickness-decreased portion being formed substantially at a center line of the light emitting surface and extending to one end of the semiconductor light emitting element so that a thickness of the wavelength conversion layer is reduced from a position substantially at the center line toward the one end of the semiconductor light emitting element where the thickness of the wavelength conversion layer is a minimum thickness; and a projection optical system configured to form a cutoff line including at least one of a horizontal cutoff line and an oblique cutoff line in a light distribution, the projection optical system configured to project a plurality of light source images each including an image portion corresponding to the thickness-decreased portion at an upper area of the light source images, and configured to arrange the image portions in at least one of a horizontal direction and an oblique direction.

2. The vehicle light according to claim 1, wherein:
the projection optical system includes a reflecting surface;
the semiconductor light emitting device is disposed such that the thickness-decreased portion is disposed on a side of the semiconductor light emitting device that is further from the reflecting surface as compared to the center line of the light emitting surface, and a light emitting direction of the semiconductor light emitting device is directed downward;
the reflecting surface is disposed in the light emitting direction of the semiconductor light emitting device; and
the reflecting surface is configured such that the plurality of light source images each including the image portion corresponding to the thickness-decreased portion at the upper area are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light.

3. The vehicle light according to claim 1, wherein:
the projection optical system includes a reflecting surface;
the semiconductor light emitting device is disposed such that the thickness-decreased portion is disposed on a side of the semiconductor light emitting device that is closer to the reflecting surface as compared to the center line of the light emitting surface, and a light emitting direction of the semiconductor light emitting device is directed upward;
the reflecting surface is disposed in the light emitting direction of the semiconductor light emitting device; and
the reflecting surface is configured such that the plurality of light source images each including the image portion corresponding to the thickness-decreased portion at the upper area are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light.

4. The vehicle light according to claim 1, wherein:
the projection optical system includes a reflecting surface;
the semiconductor light emitting device is disposed such that the thickness-decreased portion is disposed on a lower side of the device, and a light emitting direction of the semiconductor light emitting device is set horizontally;
the reflecting surface is disposed in the light emitting direction of the semiconductor light emitting device; and
the reflecting surface is configured such that the plurality of light source images each including the image portion corresponding to the thickness-decreased portion at the upper area are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light.

5. The vehicle light according to claim 1, wherein:

the projection optical system includes a reflecting surface, a shade, and a projection lens;

the semiconductor light emitting device is disposed such that the thickness-decreased portion is disposed on a side of the semiconductor light emitting device farther from the reflecting surface as compared to the center line of the light emitting surface, and a light emitting direction of the semiconductor light emitting device is directed upward;

the reflecting surface is disposed in the light emitting direction of the semiconductor light emitting device; and the reflecting surface is configured such that the plurality of light source images each including the image portion corresponding to the thickness-decreased portion at the upper area are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light.

6. The vehicle light according to claim 1, wherein:

the projection optical system includes a projection lens;

the semiconductor light emitting device is disposed such that the thickness-decreased portion is disposed on a nearer side to the projection lens and on the lower side of the device; and the projection lens is configured such that the plurality of light source images each including the image portion corresponding to the thickness-decreased portion at the upper area are projected, so that the image portions corresponding to the thickness-decreased portions are disposed in at least one of the horizontal direction and the oblique direction to form the cutoff line including at least one of the horizontal cutoff line and the oblique cutoff line on a virtual vertical plane at a distance from the vehicle light.

7. The vehicle light according to claim 1, wherein the thickness-uniform portion is formed substantially at the center line and extends to another end of the semiconductor light emitting element.

8. An illumination device, comprising:

a semiconductor light emitting device including a semiconductor light emitting element having a light emitting surface and a light emitting direction, and a wavelength conversion layer configured to cover the light emitting surface of the semiconductor light emitting element, the wavelength conversion layer having a thickness-decreased portion and a thickness-uniform portion, the thickness-decreased portion being formed substantially at a center line of the light emitting surface and extending to one end of the semiconductor light emitting element so that a thickness of the wavelength conversion layer is reduced from a position substantially at the center line toward the one end of the semiconductor light emitting element, the thickness-uniform portion being formed substantially at the center line and extending to an other end of the semiconductor light emitting element; and a reflecting surface disposed in the light emitting direction of the semiconductor light emitting device, wherein a light source image corresponding to the thickness-decreased portion is arranged along a light/dark border line of an illumination region of the illumination device.

9. The illumination device of claim 8, wherein the illumination device is configured as a vehicle lamp for illuminating a road.

10. The illumination device of claim 8, wherein a light emitting surface of the thickness-decreased portion is located closer to a portion of the reflecting surface that is closest to the light emitting semiconductor device than is a light emitting surface of the thickness-uniform portion.

11. The illumination device of claim 8, wherein a light emitting surface of the thickness-decreased portion is located further from a portion of the reflecting surface that is closest to the light emitting semiconductor device than is a light emitting surface of the thickness-uniform portion.

12. The illumination device of claim 11, further comprising:

a shade located adjacent the semiconductor light emitting device, wherein the light emitting surface of the thickness-decreased portion is located closer to the shade than is the light emitting surface of the thickness-uniform portion.

13. The illumination device of claim 8, further comprising:

a shade located adjacent the semiconductor light emitting device, wherein a light emitting surface of the thickness-decreased portion is located closer to the shade than is a light emitting surface of the thickness-uniform portion.

* * * * *